US012671066B2

(12) United States Patent　　　(10) Patent No.:　US 12,671,066 B2

Paterson et al.　　　　　　　　　　(45) Date of Patent:　Jun. 30, 2026

(54) METROLOGY ENCLOSURE INCLUDING SPECTRAL REFLECTOMETRY SYSTEM FOR PLASMA PROCESSING SYSTEM USING DIRECT-DRIVE RADIOFREQUENCY POWER SUPPLY

(71) Applicant: Lam Research Corporation, Fremont, CA (US)

(72) Inventors: Alexander Miller Paterson, San Jose, CA (US); Daniel Guzman, San Jose, CA (US); William T. Hart, Castro Valley, CA (US); Cristian Siladie, San Ramon, CA (US); Michael John Martin, Fremont, CA (US); Yuhou Wang, Fremont, CA (US); Michael Drymon, Diablo Grande, CA (US); John Drewery, San Jose, CA (US); Eduardo Castanos-Martinez, Foster City, CA (US); Jorge Luque, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 101 days.

(21) Appl. No.: 18/689,023

(22) PCT Filed: Sep. 14, 2022

(86) PCT No.: PCT/US2022/043417

§ 371 (c)(1),
(2) Date: Mar. 4, 2024

(87) PCT Pub. No.: WO2023/043763

PCT Pub. Date: Mar. 23, 2023

(65) Prior Publication Data

US 2024/0395519 A1　　　Nov. 28, 2024

Related U.S. Application Data

(60) Provisional application No. 63/245,725, filed on Sep. 17, 2021.

(51) Int. Cl.
H01J 37/32 (2006.01)

(52) U.S. Cl.
CPC ..... H01J 37/32972 (2013.01); H01J 37/3211 (2013.01); H01J 37/32174 (2013.01)

(58) Field of Classification Search
CPC ............ H01J 37/32972; H01J 37/3211; H01J 37/32174; H01J 37/321; H01J 37/32917
See application file for complete search history.

(56) References Cited

U.S. PATENT DOCUMENTS

| | | | | | | |
|---|---|---|---|---|---|---|
| 3,727,051 | A | * | 4/1973 | Page | .................. | H01J 37/20 |
| | | | | | | 250/311 |
| 6,110,337 | A | * | 8/2000 | Sullivan | .............. | C23C 14/3407 |
| | | | | | | 204/298.26 |

(Continued)

FOREIGN PATENT DOCUMENTS

| | | | |
|---|---|---|---|
| WO | 2019217180 A1 | 11/2019 |
| WO | 2020055813 A1 | 3/2020 |
| WO | 2020223127 A1 | 11/2020 |

OTHER PUBLICATIONS

PCT Application No. PCT/US2022/043417, International Search Report and Written Opinion, Mailed Jan. 2, 2023, 11 pages.

*Primary Examiner* — Patrick S Ott

(74) *Attorney, Agent, or Firm* — Polygon IP, LLP

(57) ABSTRACT

A plasma processing chamber has an upper window with a coil disposed above the upper window. A coil connection enclosure is disposed above the coil. A metrology enclosure is disposed above the coil connection enclosure. A spectral reflectometry system is disposed within the metrology enclosure. The spectral reflectometry system includes an optical collimator positioned to direct a beam of light through an opening in the metrology enclosure, an opening in the coil connection enclosure, and the upper window into the plasma processing chamber. The optical collimator is also configured to receive reflected light from within the plasma processing chamber, where the reflected light passes through the upper window and through the opening in the coil connection enclosure and through the opening in the metrology enclosure. A tip angle and a tilt angle of the optical collimator are remotely adjusted to optimize an orientation of the optical collimator.

18 Claims, 28 Drawing Sheets

Fig. 11B

(56)        References Cited

U.S. PATENT DOCUMENTS

| | | | |
|---|---|---|---|
| 2002/0140359 A1 | 10/2002 | Chen et al. | |
| 2004/0084406 A1* | 5/2004 | Kamp ............... | H01J 37/32963 |
| | | | 257/E21.218 |
| 2008/0138993 A1* | 6/2008 | Hiroshima ........ | H01L 21/67253 |
| | | | 156/345.35 |
| 2008/0272089 A1* | 11/2008 | Grimbergen ...... | H01J 37/32935 |
| | | | 216/60 |
| 2009/0278598 A1 | 11/2009 | van Zyl et al. | |
| 2012/0262064 A1 | 10/2012 | Nagarkatti et al. | |
| 2013/0160793 A1* | 6/2013 | Srivastava .............. | G03F 7/427 |
| | | | 134/1.1 |
| 2016/0236279 A1 | 8/2016 | Ashton et al. | |
| 2016/0282440 A1 | 9/2016 | Tanaka | |
| 2018/0092196 A1 | 3/2018 | Notomi et al. | |
| 2019/0116656 A1 | 4/2019 | Long et al. | |
| 2019/0177848 A1 | 6/2019 | Chen et al. | |
| 2019/0385821 A1 | 12/2019 | Long et al. | |
| 2020/0111644 A1* | 4/2020 | Long ...................... | H03K 5/135 |
| 2020/0357616 A1 | 11/2020 | Allen et al. | |

* cited by examiner

(View A-A)

Figure 12A:
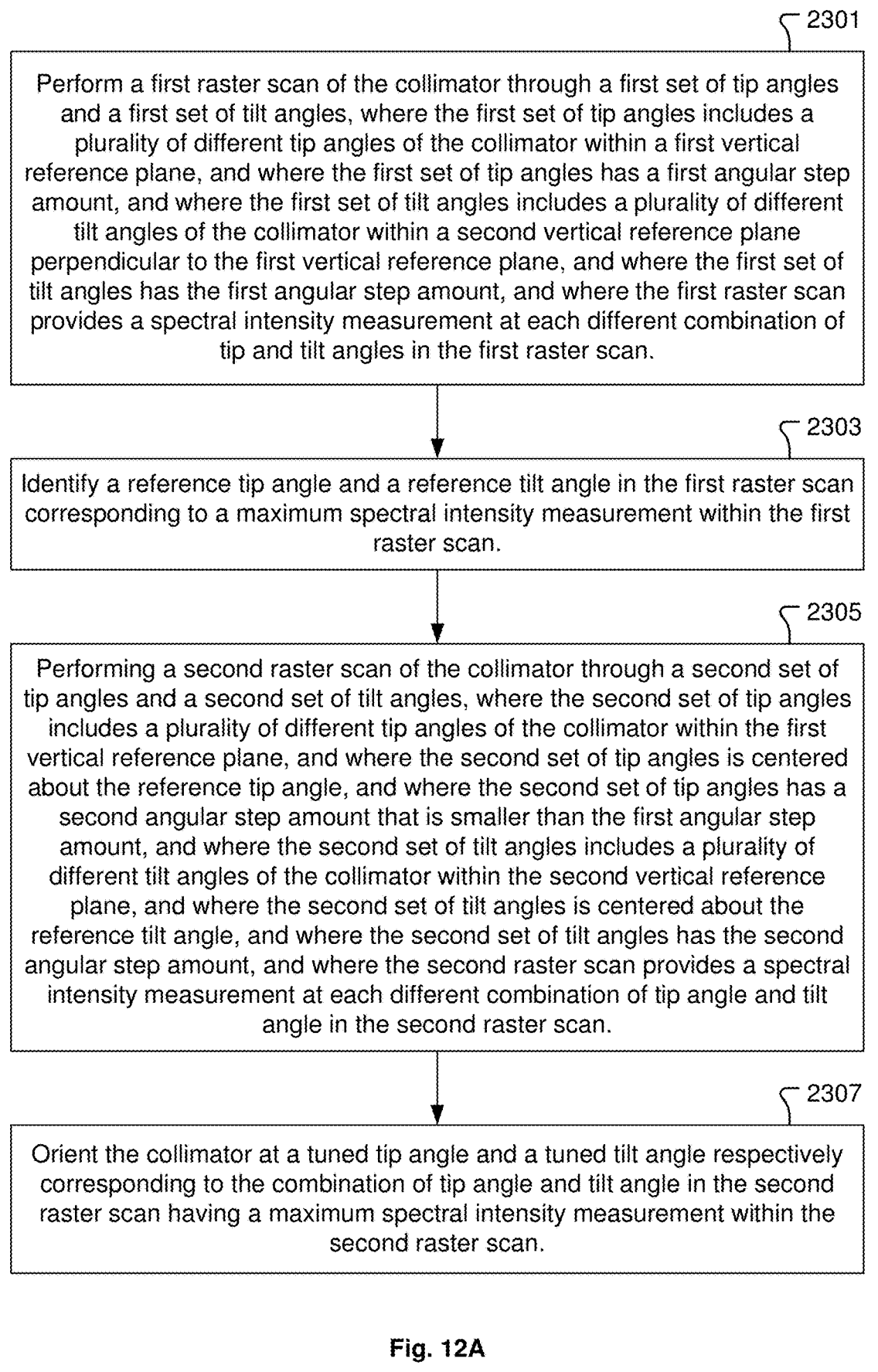

2301

Perform a first raster scan of the collimator through a first set of tip angles and a first set of tilt angles, where the first set of tip angles includes a plurality of different tip angles of the collimator within a first vertical reference plane, and where the first set of tip angles has a first angular step amount, and where the first set of tilt angles includes a plurality of different tilt angles of the collimator within a second vertical reference plane perpendicular to the first vertical reference plane, and where the first set of tilt angles has the first angular step amount, and where the first raster scan provides a spectral intensity measurement at each different combination of tip and tilt angles in the first raster scan.

2303

Identify a reference tip angle and a reference tilt angle in the first raster scan corresponding to a maximum spectral intensity measurement within the first raster scan.

2305

Performing a second raster scan of the collimator through a second set of tip angles and a second set of tilt angles, where the second set of tip angles includes a plurality of different tip angles of the collimator within the first vertical reference plane, and where the second set of tip angles is centered about the reference tip angle, and where the second set of tip angles has a second angular step amount that is smaller than the first angular step amount, and where the second set of tilt angles includes a plurality of different tilt angles of the collimator within the second vertical reference plane, and where the second set of tilt angles is centered about the reference tilt angle, and where the second set of tilt angles has the second angular step amount, and where the second raster scan provides a spectral intensity measurement at each different combination of tip angle and tilt angle in the second raster scan.

2307

Orient the collimator at a tuned tip angle and a tuned tilt angle respectively corresponding to the combination of tip angle and tilt angle in the second raster scan having a maximum spectral intensity measurement within the second raster scan.

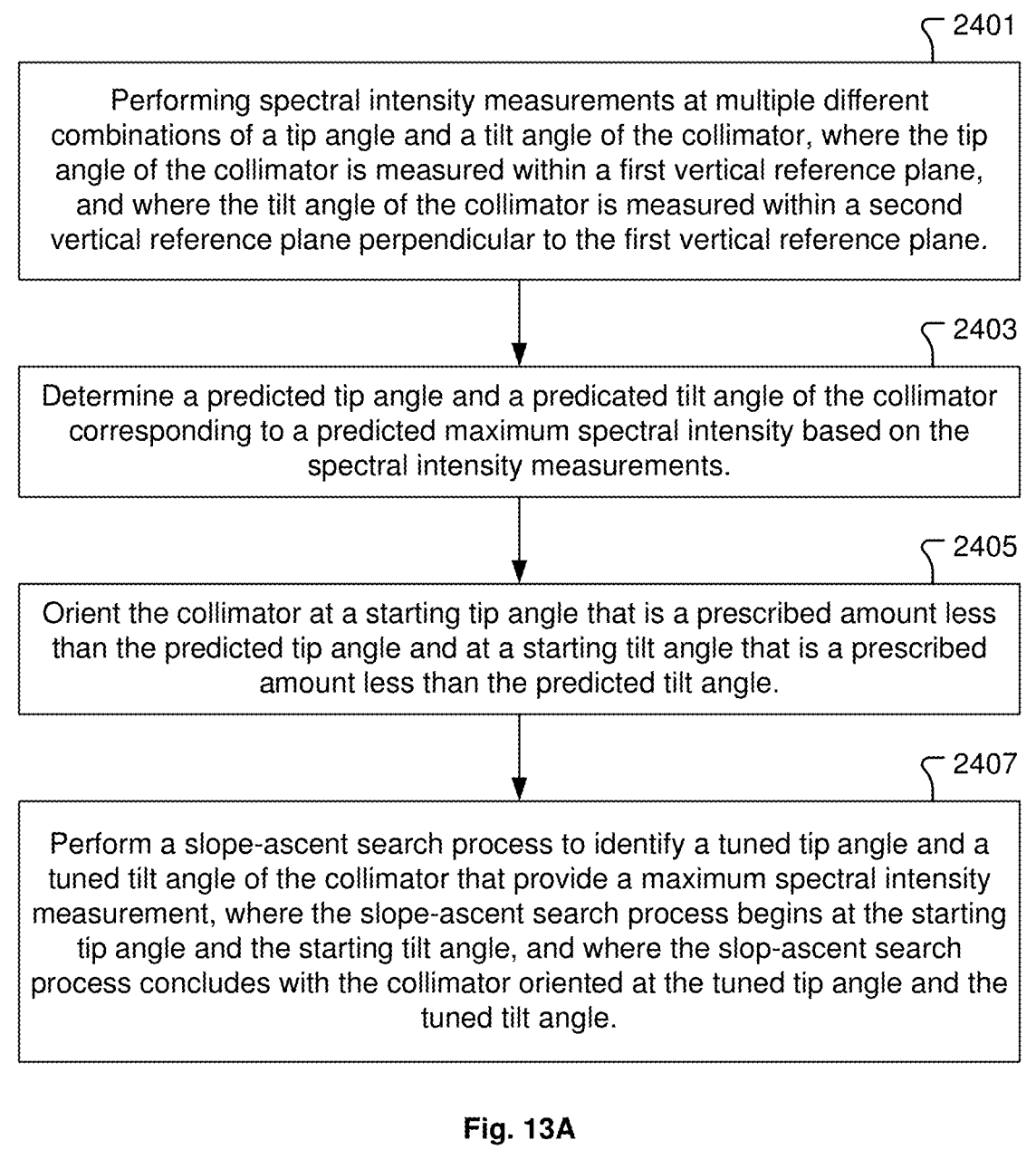

Performing spectral intensity measurements at multiple different combinations of a tip angle and a tilt angle of the collimator, where the tip angle of the collimator is measured within a first vertical reference plane, and where the tilt angle of the collimator is measured within a second vertical reference plane perpendicular to the first vertical reference plane.

⌐ 2403

Determine a predicted tip angle and a predicated tilt angle of the collimator corresponding to a predicted maximum spectral intensity based on the spectral intensity measurements.

⌐ 2405

Orient the collimator at a starting tip angle that is a prescribed amount less than the predicted tip angle and at a starting tilt angle that is a prescribed amount less than the predicted tilt angle.

⌐ 2407

Perform a slope-ascent search process to identify a tuned tip angle and a tuned tilt angle of the collimator that provide a maximum spectral intensity measurement, where the slope-ascent search process begins at the starting tip angle and the starting tilt angle, and where the slop-ascent search process concludes with the collimator oriented at the tuned tip angle and the tuned tilt angle.

Fig. 13A

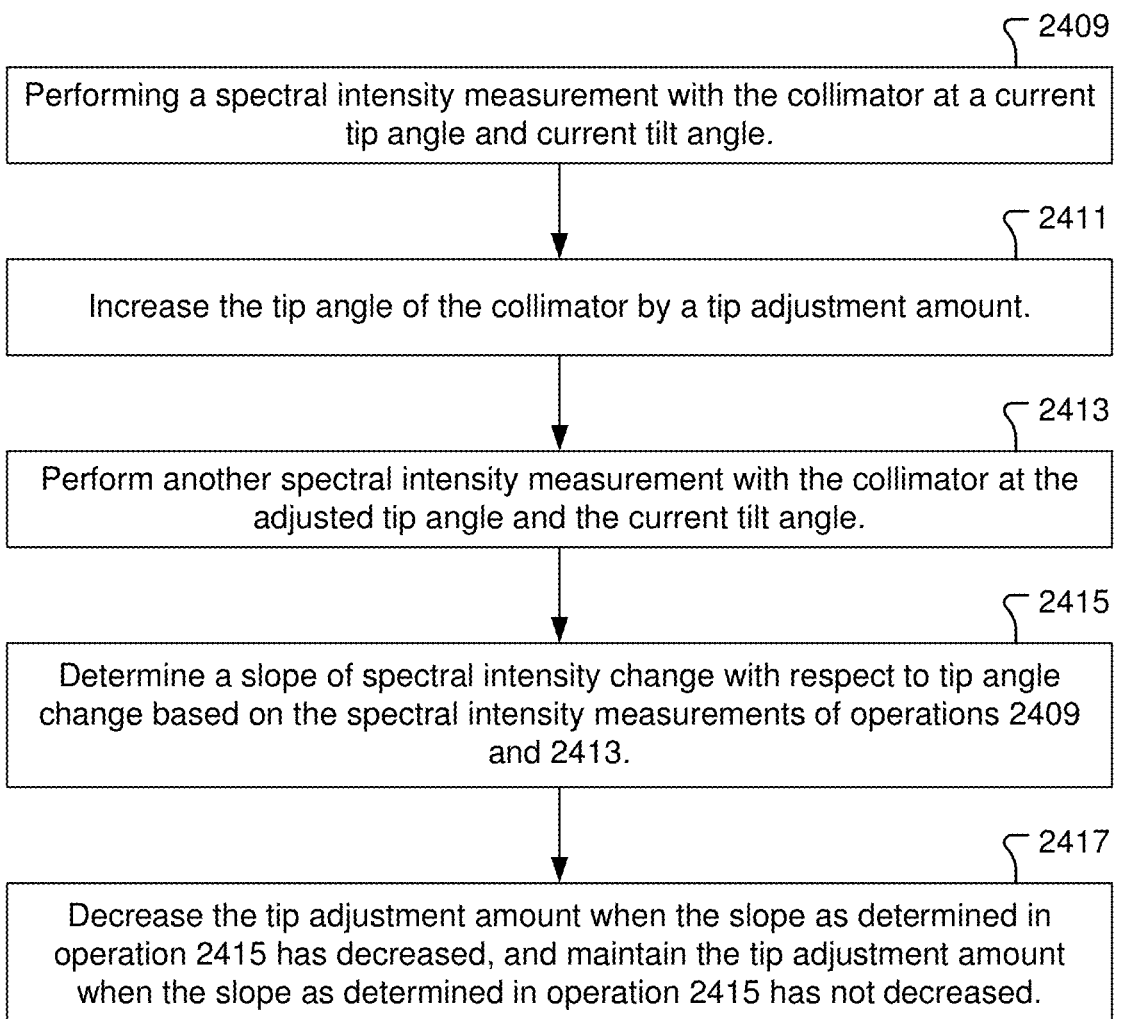

2409

Performing a spectral intensity measurement with the collimator at a current tip angle and current tilt angle.

2411

Increase the tip angle of the collimator by a tip adjustment amount.

2413

Perform another spectral intensity measurement with the collimator at the adjusted tip angle and the current tilt angle.

2415

Determine a slope of spectral intensity change with respect to tip angle change based on the spectral intensity measurements of operations 2409 and 2413.

2417

Decrease the tip adjustment amount when the slope as determined in operation 2415 has decreased, and maintain the tip adjustment amount when the slope as determined in operation 2415 has not decreased.

Performing a spectral intensity measurement with the collimator at a current tip angle and a current tilt angle.

2421

Increase the tilt angle of the collimator by a tilt adjustment amount.

2423

Perform another spectral intensity measurement with the collimator a the current tip angle and the adjusted tilt angle.

2425

Determine a slope of spectral intensity change with respect to tilt angle change based on the spectral intensity measurements of operations 2419 and 2423.

2427

Decrease the tilt adjustment amount when the slope as determined in operation 2425 has decreased, and maintain the tilt adjustment amount when the slope as determined in operation 2425 has not decreased.

Fig. 13E

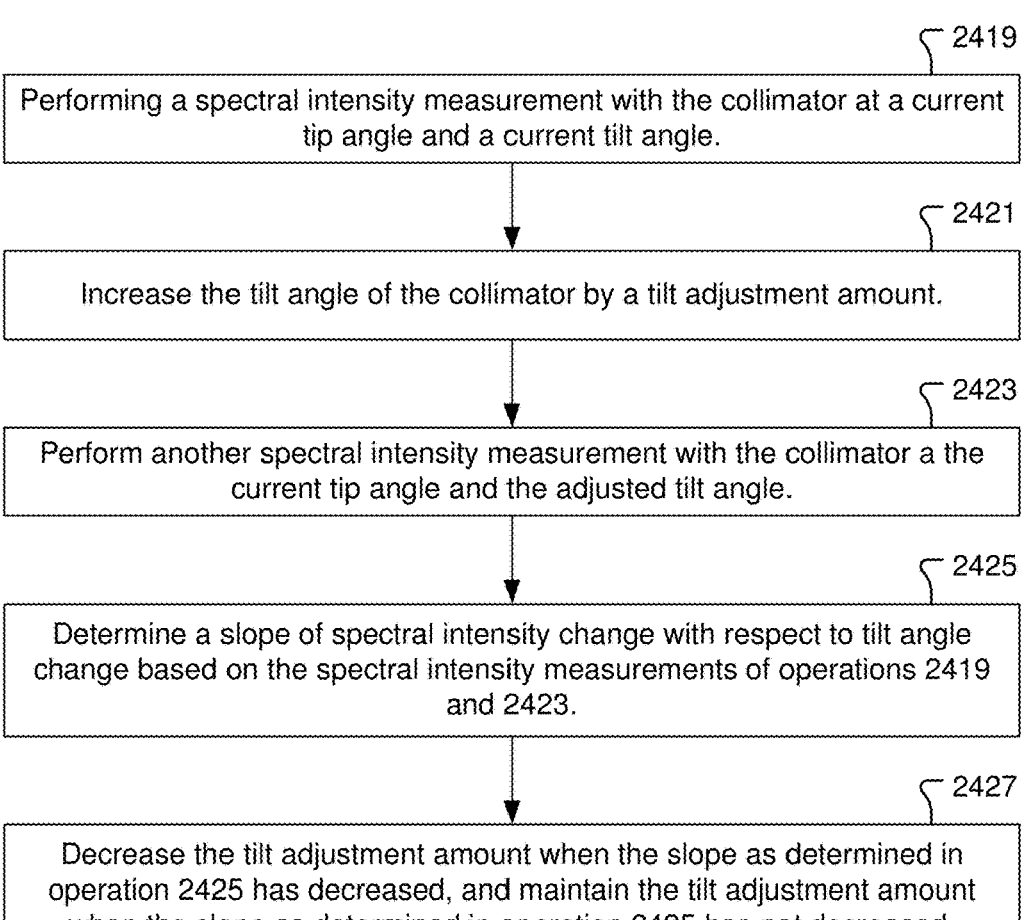

Fig. 13F

METROLOGY ENCLOSURE INCLUDING SPECTRAL REFLECTOMETRY SYSTEM FOR PLASMA PROCESSING SYSTEM USING DIRECT-DRIVE RADIOFREQUENCY POWER SUPPLY

This application is a national stage filing of and claims priority, under 35 U.S.C. § 371, to PCT/US2022/043417, filed on Sep. 14, 2022, which claims the benefit of U.S. Provisional Application No. 63/245,725, filed on Sep. 17, 2021. The entire disclosure of each application referenced above is incorporated herein by reference.

BACKGROUND

Plasma processing systems are used to manufacture semiconductor devices, e.g., chips/die, on semiconductor wafers. In the plasma processing system, the semiconductor wafer is exposed to various types of plasma to cause prescribed changes to a condition of the semiconductor wafer, such as through material deposition and/or material removal and/or material implantation and/or material modification, etc. The plasma processing system conventionally includes a radiofrequency (RF) source, an RF transmission cable, an RF impedance matching network, an electrode, and a plasma generation chamber. The RF source is connected to the RF impedance matching network through the RF transmission cable. The RF impedance matching network is connected to the electrode through a electrical conductor. RF power generated by the RF source is transmitted through the RF transmission cable and through the RF impedance matching network to the electrode. RF power transmitted from the electrode causes a process gas to be transformed into a plasma within the plasma generation chamber. It is within this context that embodiments described in the present disclosure arise.

SUMMARY

In an example embodiment, a plasma processing system is disclosed. The plasma processing system includes a plasma processing chamber that has an upper window. The plasma processing system also includes a coil disposed above the upper window. The plasma processing system also includes a coil connection enclosure disposed above the coil. The plasma processing system also includes a metrology enclosure disposed above the coil connection enclosure. The plasma processing system also includes a spectral reflectometry system disposed within the metrology enclosure. The spectral reflectometry system includes an optical collimator positioned to direct a beam of light through an opening in the metrology enclosure, an opening in the coil connection enclosure, and the upper window into the plasma processing chamber. The optical collimator is also configured to receive reflected light from within the plasma processing chamber, where the reflected light passes through the upper window and through the opening in the coil connection enclosure and through the opening in the metrology enclosure.

In an example embodiment, a method is disclosed for tuning an orientation of an optical collimator of a spectral reflectometry system for a plasma processing system. The method includes performing a first raster scan of the optical collimator through a first set of tip angles and a first set of tilt angles. The first set of tip angles includes a plurality of different tip angles of the optical collimator within a first vertical reference plane. The first set of tip angles has a first angular step amount. The first set of tilt angles includes a plurality of different tilt angles of the optical collimator within a second vertical reference plane perpendicular to the first vertical reference plane. The first set of tilt angles also has the first angular step amount. The first raster scan provides a spectral intensity measurement at each different combination of tip angle and tilt angle in the first raster scan. The method also includes identifying a reference tip angle and a reference tilt angle in the first raster scan corresponding to a maximum spectral intensity measurement within the first raster scan. The method also includes performing a second raster scan of the optical collimator through a second set of tip angles and a second set of tilt angles. The second set of tip angles includes a plurality of different tip angles of the optical collimator within the first vertical reference plane. The second set of tip angles is centered about the reference tip angle. The second set of tip angles has a second angular step amount that is smaller than the first angular step amount. The second set of tilt angles includes a plurality of different tilt angles of the optical collimator within the second vertical reference plane. The second set of tilt angles is centered about the reference tilt angle. The second set of tilt angles also has the second angular step amount. The second raster scan provides a spectral intensity measurement at each different combination of tip angle and tilt angle in the second raster scan. The method also includes orienting the optical collimator at a tuned tip angle and a tuned tilt angle respectively corresponding to the combination of tip angle and tilt angle in the second raster scan that has a maximum spectral intensity measurement within the second raster scan.

In an example embodiment, a method is disclosed for tuning an orientation of an optical collimator of a spectral reflectometry system for a plasma processing system. The method includes performing spectral intensity measurements at multiple different combinations of a tip angle and a tilt angle of the optical collimator. The tip angle of the optical collimator is measured within a first vertical reference plane. The tilt angle of the optical collimator is measured within a second vertical reference plane perpendicular to the first vertical reference plane. The method also includes determining a predicted tip angle and a predicted tilt angle of the optical collimator corresponding to a predicted maximum spectral intensity based on the spectral intensity measurements. The method also includes orienting the optical collimator at a starting tip angle that is a prescribed amount less than the predicted tip angle and at a starting tilt angle that is a prescribed amount less than the predicted tilt angle. The method also includes performing a slope-ascent search process to identify a tuned tip angle and a tuned tilt angle of the optical collimator that provide a maximum spectral intensity measurement. The slope-ascent search process begins at the starting tip angle and the starting tilt angle. The slope-ascent search process concludes with the optical collimator oriented at the tuned tip angle and the tuned tilt angle.

Other aspects and advantages of the embodiments will become more apparent from the following detailed description and the accompanying drawings.

BRIEF DESCRIPTION OF THE DRAWINGS

FIG. 1B shows a front view of the plasma processing system of FIG. 1A, in accordance with some embodiments.

FIG. 12A shows a flowchart of a method for tuning an orientation of the optical collimator of the spectral reflectometry system for the plasma processing system, in accordance with some embodiments.

FIG. 13A shows a flowchart of a method for tuning an orientation of the optical collimator of the spectral reflectometry system for the plasma processing system, in accordance with some embodiments.

FIG. 13D shows a flowchart of a method for performing each tip angle ascent step in the slope-ascent search process, in accordance with some embodiments.

FIG. 13E shows a flowchart of a method for performing each tilt angle ascent step in the slope-ascent search process, in accordance with some embodiments.

FIG. 13F shows an example plot of the slope-ascent search process performed in the operation, in accordance with some embodiments.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Figure 1A:
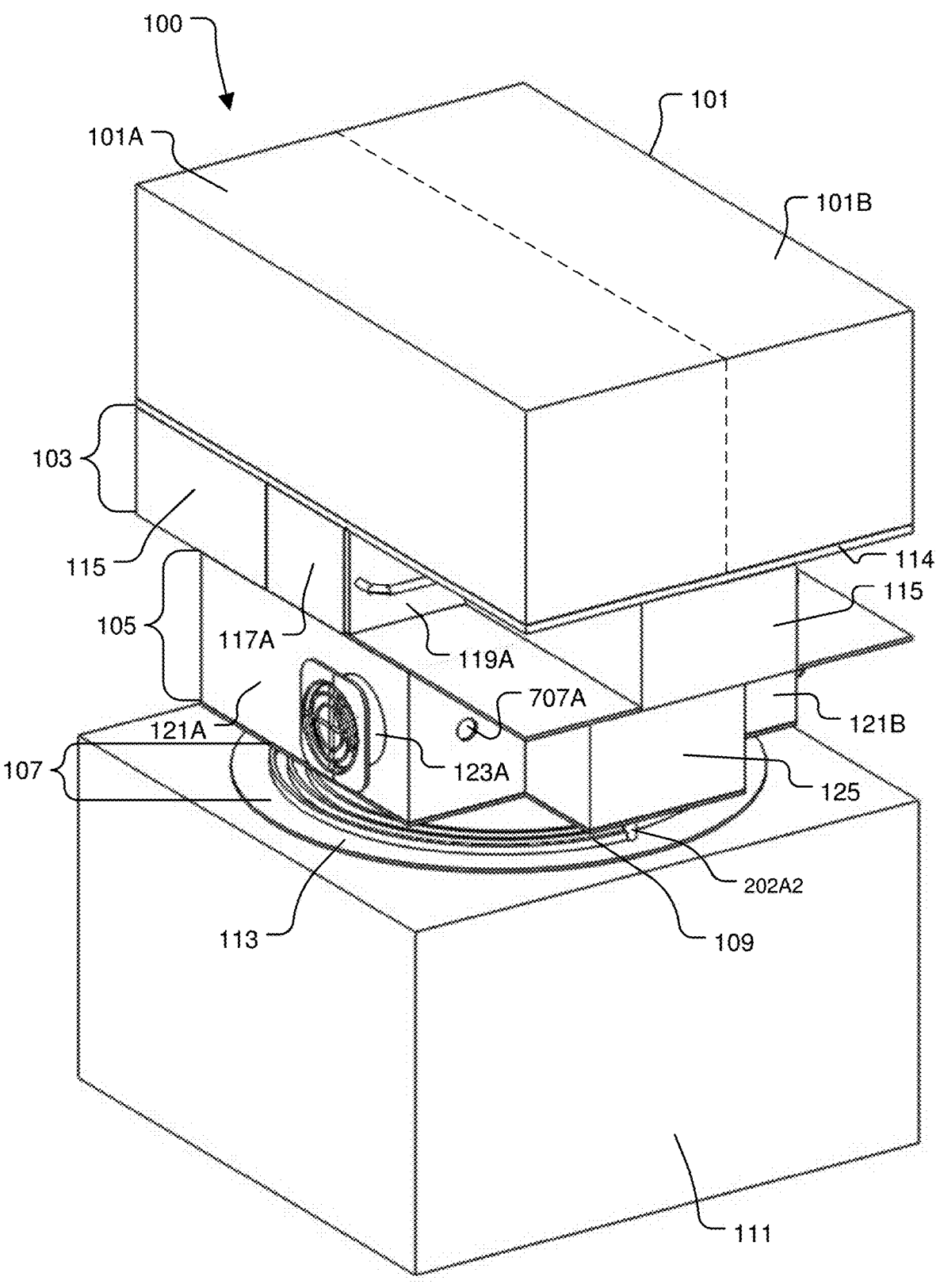
FIG. 1A shows an isometric view of a plasma processing system that includes a direct-drive RF power supply, in accordance with some embodiments.
Figure 1B:
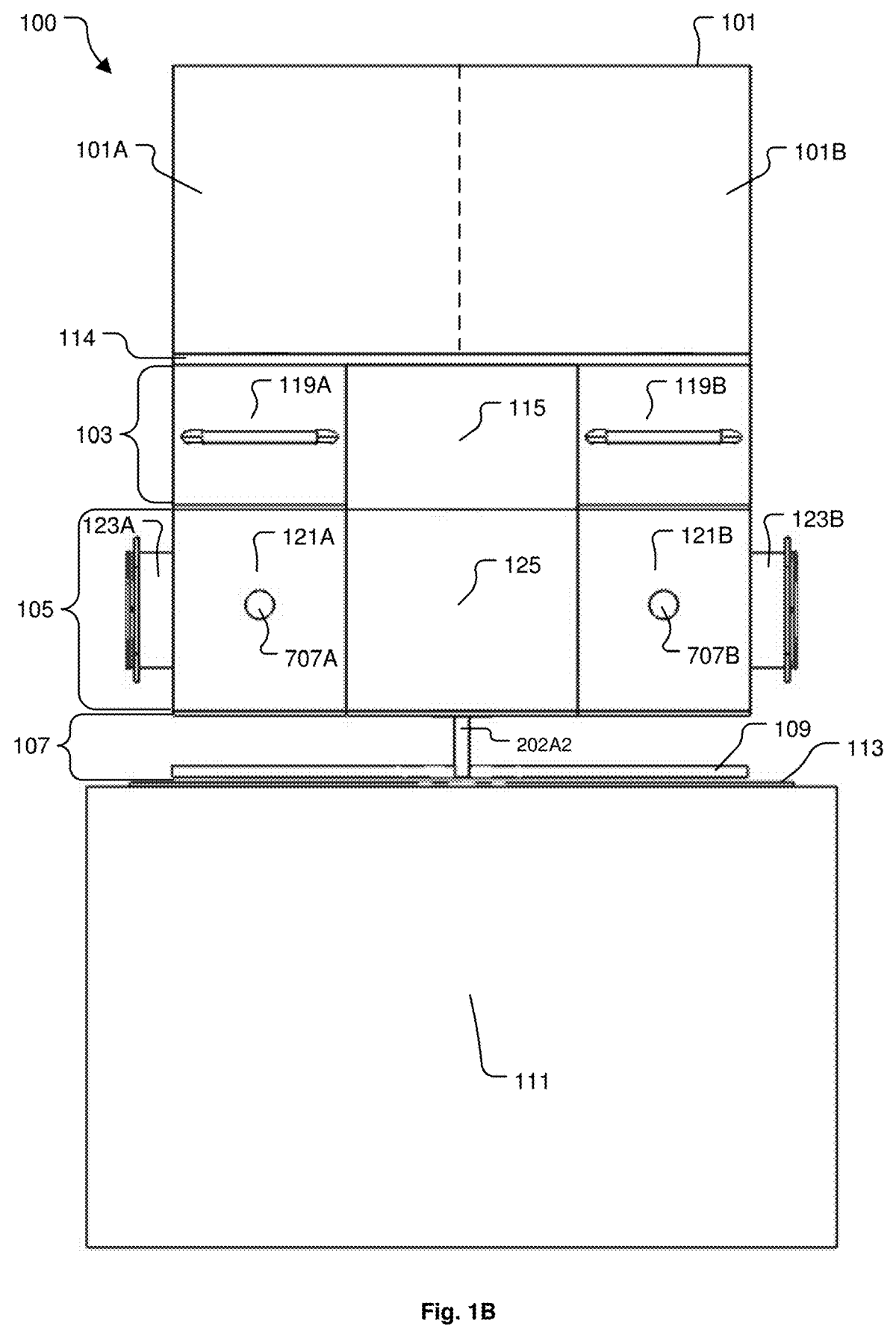
Figure 1C:
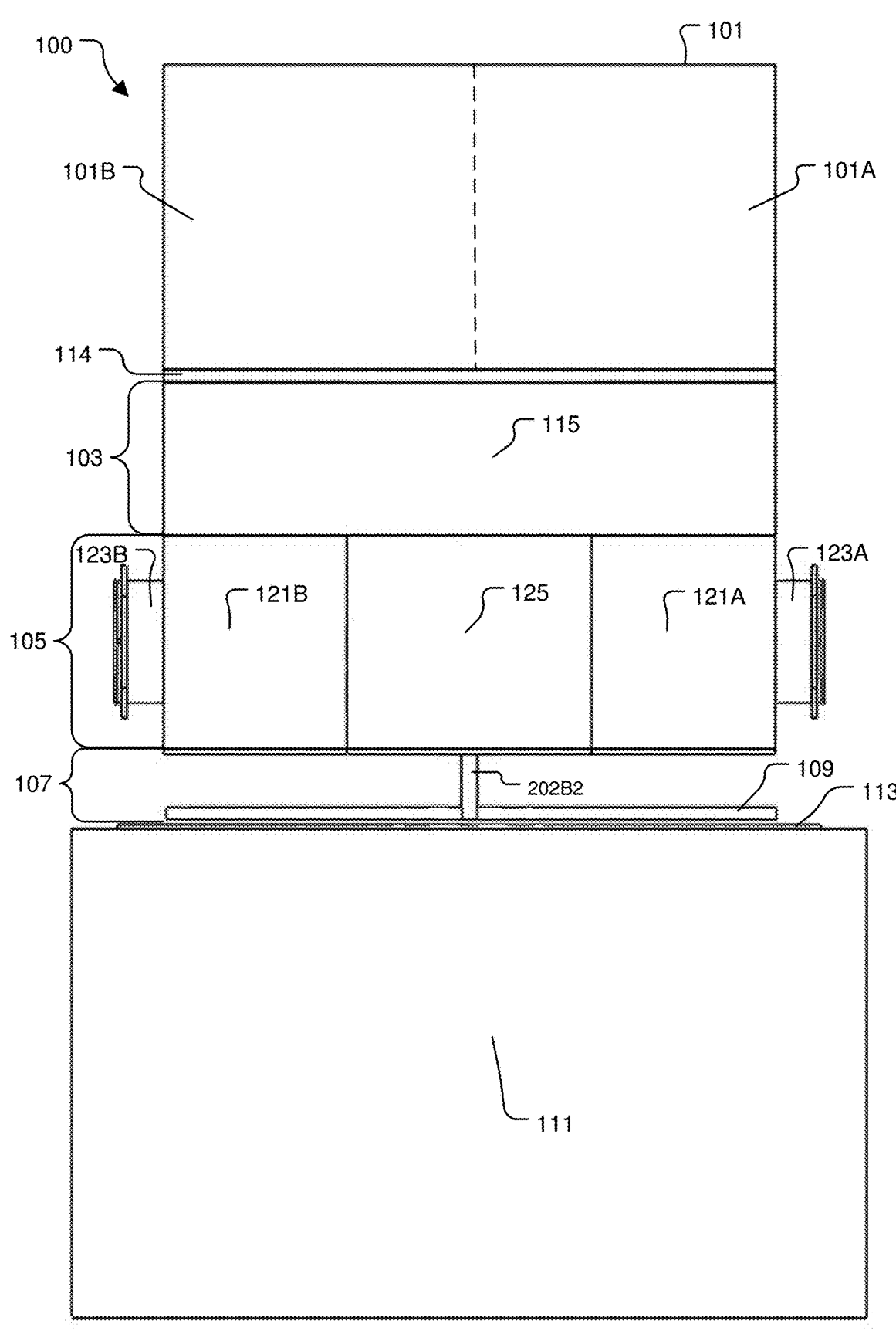
FIG. 1C shows a back view of the plasma processing system of FIG. 1A, in accordance with some embodiments.
Figure 1D:
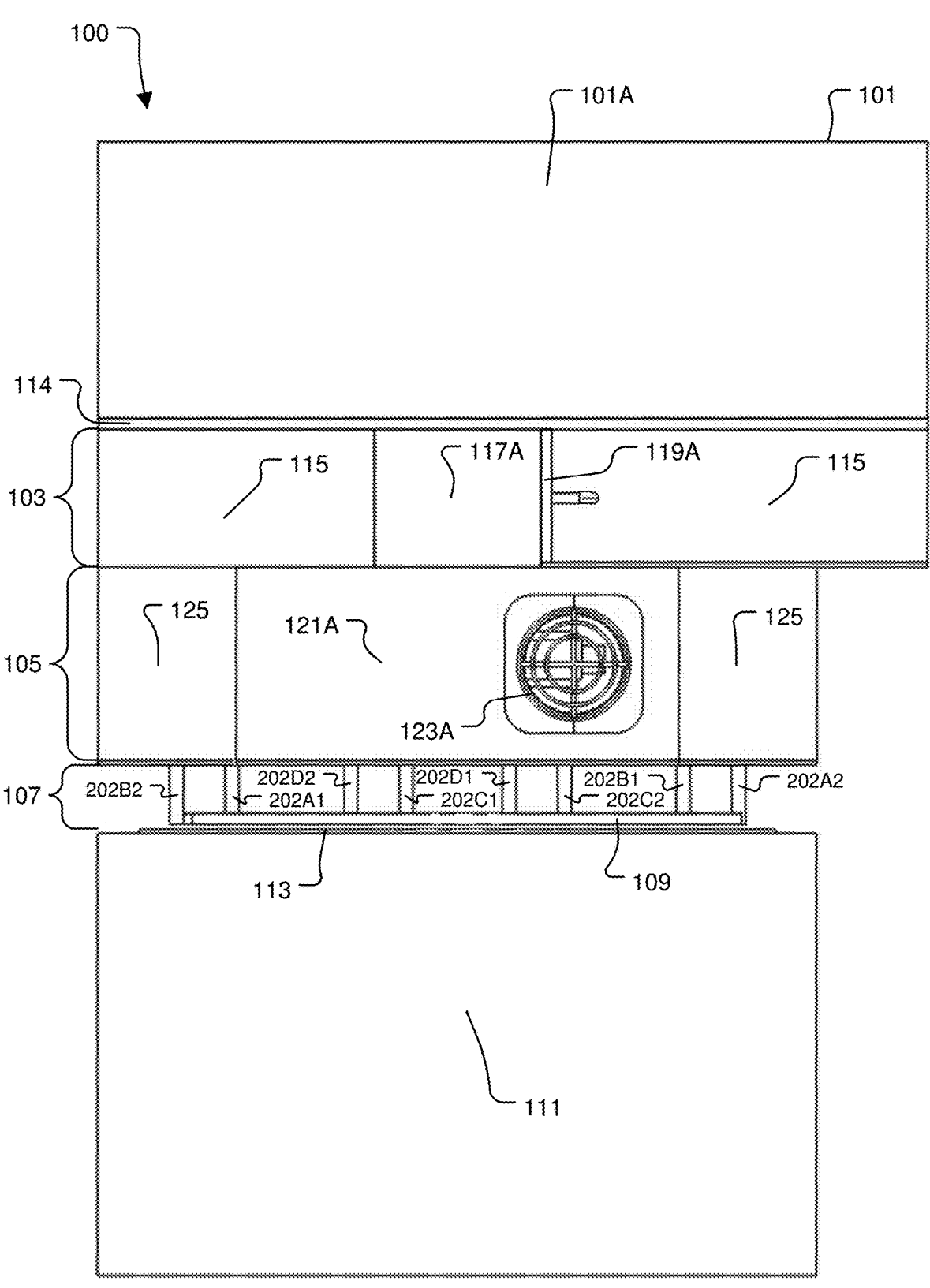
FIG. 1D shows a left-side view of the plasma processing system of FIG. 1A, in accordance with some embodiments.
Figure 1E:
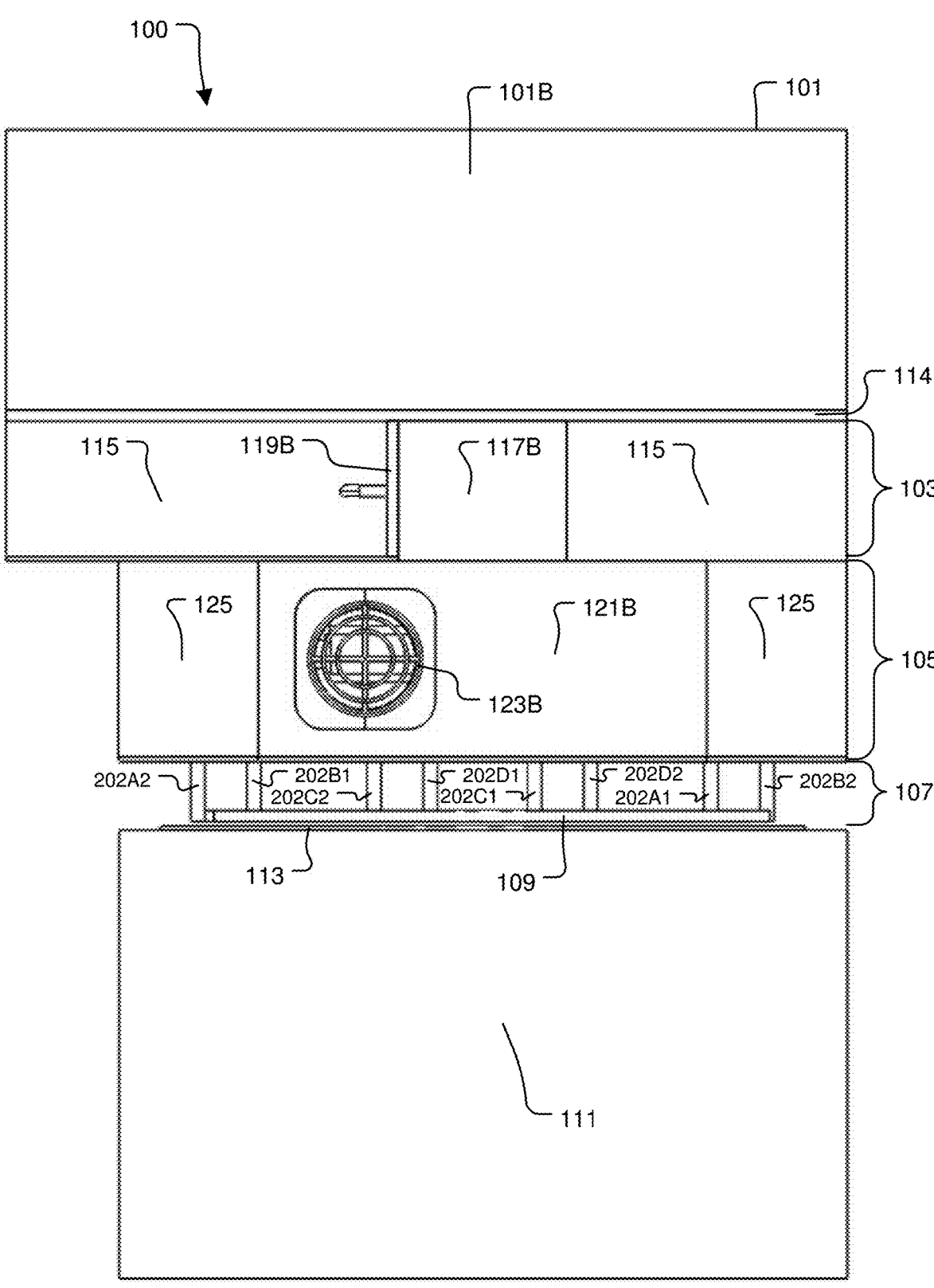
FIG. 1E shows a right-side view of the plasma processing system of FIG. 1A, in accordance with some embodiments.

FIG. 1A shows an isometric view of a plasma processing system 100 that includes a direct-drive radiofrequency (RF) power supply 101, in accordance with some embodiments. FIG. 1B shows a front view of the plasma processing system 100, in accordance with some embodiments. FIG. 1C shows a back view of the plasma processing system 100, in accordance with some embodiments. FIG. 1D shows a left-side view of the plasma processing system 100, in accordance with some embodiments. FIG. 1E shows a right-side view of the plasma processing system 100, in accordance with some embodiments.

The direct-drive RF power supply 101 is configured to generate and deliver RF power to a plasma processing chamber 111 without having to transmit RF signals through an RF cable and an impedance matching network in route to the plasma processing chamber 111. The direct-drive RF power supply 101 is also referred to as a matchless plasma source (MPS). In the example embodiment of FIGS. 1A-1E, the direct-drive RF power supply 101 is connected to deliver RF power to a coil assembly 109 disposed above a window 113 of the plasma processing chamber 111. In various embodiments, the window 113 is formed of a dielectric material, such as quartz, that allows RF power to be transmitted from the coil assembly 109 through the window 113 and into the plasma processing chamber 111. As the RF power is transmitted into and through the plasma processing chamber 111, the RF power transforms a process gas into a plasma within the plasma processing chamber 111 in exposure to a semiconductor wafer that is supported within the plasma processing chamber 111. In various embodiments, the plasma is used to provide controlled modification of a condition of the semiconductor wafer, such as through material deposition and/or material removal and/or material implantation and/or material modification, etc. Also, in some embodiments, a plasma is generated in the plasma processing chamber 111 to provide for cleaning of the plasma processing chamber 111. The direct-drive RF power supply 101 is configured to generate RF signals having a prescribed waveform as a function of time, and deliver the generated RF signals to the coil assembly 109.

Figure 2:
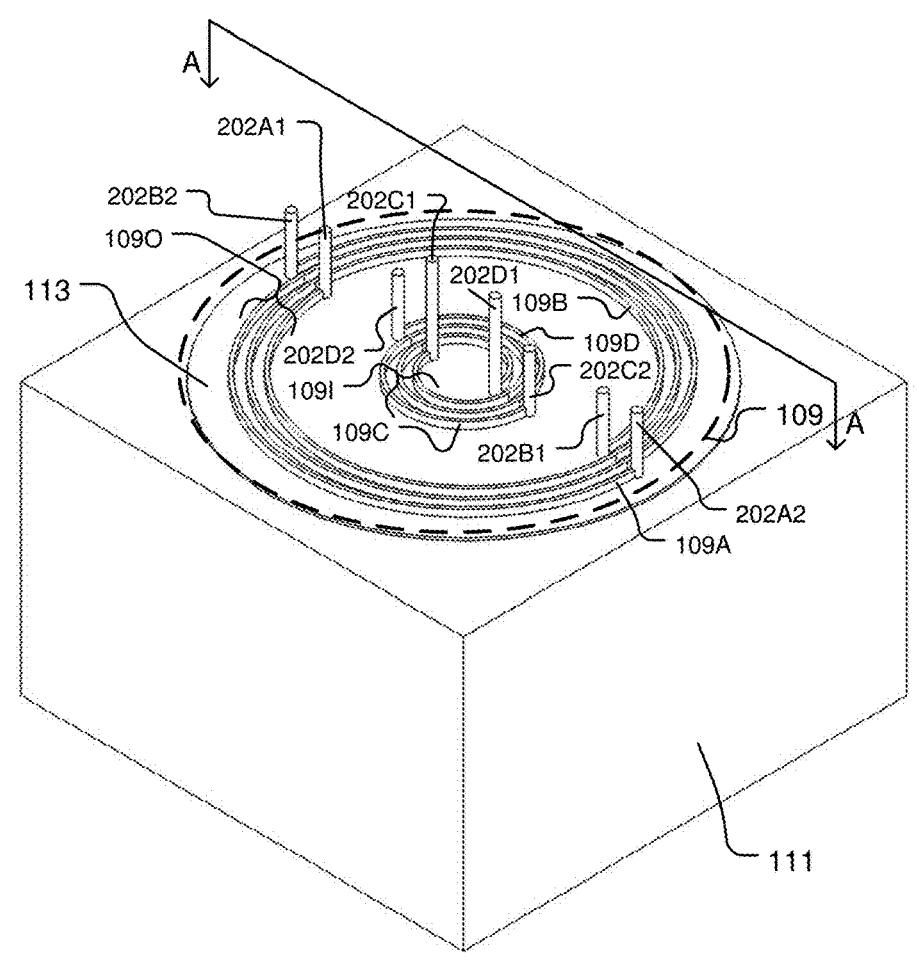
FIG. 2 shows a top view of the coil assembly, in accordance with some embodiments.

FIG. 2 shows a top view of the coil assembly 109, in accordance with some embodiments. In some embodiments, the coil assembly 109 includes an outer coil 109O that includes a first outer coil winding 109A and a second outer coil winding 109B. In some embodiments, the first outer coil winding 109A and second outer coil winding 109B are interleaved with each other so as to be positioned in an alternating sequence relative to a radial direction extending horizontally outward from the center of the of the coil assembly 109. A first end of the first outer coil winding 109A is connected to receive RF power from the direct-drive RF power supply 101 through a connector 202A1. A second end of the first outer coil winding 109A is connected to a reference ground potential through a connector 202A2. A first end of the second outer coil winding 109B is connected to receive RF power from the direct-drive RF power supply 101 through a connector 202B1. A second end of the second outer coil winding 109B is connected to a reference ground potential through a connector 202B2. In some embodiments, the coil assembly 109 includes an inner coil 109I that includes a first inner coil winding 109C and a second inner coil winding 109D. In some embodiments, the first inner coil winding 109C and second inner coil winding 109D are interleaved with each other so as to be positioned in an alternating sequence relative to a radial direction extending horizontally outward from the center of the of the coil assembly 109. A first end of the first inner coil winding 109C is connected to receive RF power from the direct-drive RF power supply 101 through a connector 202C1. A second end of the first inner coil winding 109C is connected to a reference ground potential through a connector 202C2. A first end of the second inner coil winding 109D is connected to receive RF power from the direct-drive RF power supply 101 through a connector 202D1. A second end of the second inner coil winding 109D is connected to a reference ground potential through a connector 202D2. It should be understood that the coil assembly 109 is shown by way of example. In various embodiments, the coil assembly 109 can include a single coil winding or multiple coil windings. Also, in various embodiments, the multiple windings of the coil assembly 109 can be arranged into multiple, e.g., 2, 3, 4, etc., coil regions, such as the inner coil 109I region and the outer coil 109O region as shown in FIG. 2. In some embodiments, each coil winding in the coil assembly 109 is connected to receive RF power from the direct-drive RF power supply 101, regardless of the coil assembly 109 configuration.

In some embodiments, the direct-drive RF power supply 101 includes a plurality of direct-drive RF signal generators that independently generate and supply RF signals to different portions of the coil assembly 109. For example, in some embodiments, such as shown in FIGS. 1A-1E, the direct-drive RF power supply 101 includes a first direct-drive RF signal generator 101A and a second direct-drive RF signal generator 101B. The first direct-drive RF signal generator 101A is connected to generate and supply RF signals to the first outer coil winding 109A and the second outer coil winding 109B of the coil assembly 109. The second direct-drive RF signal generator 101B is connected to generate and supply RF signals to the first inner coil windings 109C and the second inner coil winding 109D of the coil assembly 109. It should be understood that in various embodiments the direct-drive RF power supply 101 includes more than two direct-drive RF signal generators for generating and supplying RF signals to more than two coils, respectively, within the coil assembly 109, where each coil in the coil assembly 109 includes one or more coil windings. Also, in some embodiments, the direct-drive RF power supply 101 includes a single direct-drive RF signal generator for generating and supplying RF signals to a single coil within the coil assembly 109, where the single coil includes one or more coil windings.

In some embodiments, such as shown in FIGS. 1A-1E, the direct-drive RF power supply 101 is disposed above the plasma processing chamber 111, with the direct-drive RF power supply 101 being separated from the plasma processing chamber 111 by a metrology level 103, an RF power junction level 105, and a coil assembly level 107. In some embodiments, the metrology level 103 is located vertically between the direct-drive RF power supply 101 and the junction box level 105, with the coil assembly level 107 located below the junction box level 105. The metrology level 103 includes a metrology enclosure 115. In some embodiments, the metrology enclosure 115 has a T-shaped interior volume when viewed from above the metrology enclosure 115. In various embodiments, metrology equipment, e.g., optical metrology equipment, thermal metrology equipment, electrical metrology equipment, etc., is disposed within the interior volume of the metrology enclosure 115. It should be understood that this provides for positioning metrology equipment in close proximity to the plasma processing chamber 111 and coil assembly 109, which provides for simplification of metrology equipment deployment and connectivity. In some embodiments, a platform 114 is disposed over the metrology enclosure 115. The platform 114 provides a base structure to support the direct-drive RF power supply 101.

In some embodiments, the metrology level 103 also includes a first RF connection enclosure 117A and a second RF connection enclosure 117B. The first RF connection enclosure 117A is formed to provide a protected region within and through which RF connection structures are disposed to provide for transmission of RF power from the first direct-drive RF signal generator 101A to the outer coil 109O of the coil assembly 109. A removable door 119A is provided to cover an access opening 502A (see FIG. 4) into the region within the first RF connection enclosure 117A. The second RF connection enclosure 117B is formed to provide a protected region within and through which RF connection structures are disposed to provide for transmission of RF power from the second direct-drive RF signal generator 101B to the inner coil 109I of the coil assembly 109. A removable door 119B is provided to cover an access opening 502B (see FIG. 4) into the region within the second RF connection enclosure 117B.

The junction box level 105 includes a first junction box 121A, a second junction box 121B, and a coil connection enclosure 125. In some embodiments, the coil connection enclosure 125 is substantially centered on the plasma processing chamber 111 and is correspondingly substantially centered on the coil assembly 109 disposed above the window 113 of the plasma processing chamber 111. The first junction box 121A includes an interior region in which a first reactive circuit 901 is disposed, with the first reactive circuit 901 being connected between the first direct-drive RF signal generator 101A and the outer coil 109O of the coil assembly 109. The second junction box 121B includes an interior region in which a second reactive circuit 1001 is disposed, with the second reactive circuit 1001 being connected between the second direct-drive RF signal generator 101B and the inner coil 109I of the coil assembly 109. The coil connection enclosure 125 includes an interior region in which a first conductive structure 1101 is disposed to electrically connect the first reactive circuit 901 to the outer coil 109O of the coil assembly 109, and in which a second conductive structure 1107 is disposed to electrically connect the second reactive circuit 1001 to the inner coil 109I of the coil assembly 109. The coil connection enclosure 125 also houses a third conductive structure 1103 and a fourth conductive structure 1105 to provide for electrical connection of the outer coil 109O of the coil assembly 109 to a reference ground potential, such as to the reference ground potential that exists on the walls of the coil connection enclosure 125. The coil connection enclosure 125 also houses a fifth conductive structure 1109 to provide a ground return electrical connection from the inner coil 109I of the coil assembly 109 to second reactive circuit 1001.

In some embodiments, the first junction box 121A is equipped with a fan 123A to circulate air through the interior region of the first junction box 121A to maintain cooling of components within the first reactive circuit 901. Similarly, in some embodiments, the second junction box 121B is equipped with a fan 123B to circulate air through the interior region of the second junction box 121B to maintain cooling of components within the second reactive circuit 1001. Also, in some embodiments, the first junction box 121A includes an access port 707A through which a device or tool can be disposed to provide for adjustment of one or more of component(s) within the first reactive circuit 901, such as to provide for adjustment of a setting of a variable capacitor within the first reactive circuit 901. Similarly, in some embodiments, the second junction box 121B includes an access port 707B through which a device or tool can be disposed to provide for adjustment of one or more of component(s) within the second reactive circuit 1001, such as to provide for adjustment of a setting of a variable capacitor within the second reactive circuit 1001.

Figure 3:
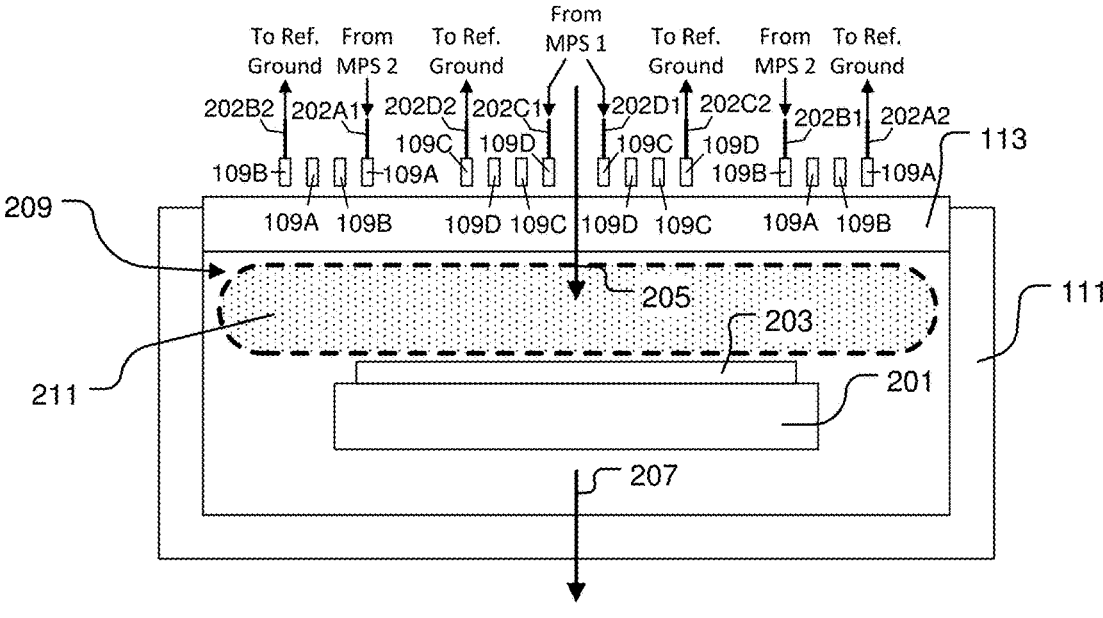
FIG. 3 shows a diagram of a vertical cross-section taken through the plasma processing chamber, in accordance with some embodiments.

FIG. 3 shows a diagram of a vertical cross-section taken through the plasma processing chamber 111, in accordance with some embodiments. The vertical cross-section diagram of FIG. 3 corresponds to the View A-A as referenced in FIG. 2. It should be understood that the vertical cross-section diagram of FIG. 3 depicts a simplified representation of the plasma processing chamber 111. In various embodiments, the plasma processing chamber 111 includes other components and features that are not shown in FIG. 3, in order to avoid unnecessarily obscuring the relevant description of the plasma processing chamber 111. Also, in various embodiments, the components that are depicted in FIG. 3 can be shaped, positioned, and oriented in ways that differ from their particular representation in FIG. 3, without departing from their intended purpose as discussed herein. The plasma processing chamber 111 includes a substrate support 201, e.g., an electrostatic chuck, on which a substrate 203, e.g., a semiconductor wafer, is supported during plasma processing of the substrate 203. During operation of the plasma processing chamber 111, a process gas is flowed into a processing region 209 within the plasma processing chamber 111, as indicated by arrow 205. Also, during operation of the plasma processing chamber 111, RF power is supplied from the first direct-drive RF signal generator 101A to the outer coil 109O and/or from the second direct-drive RF signal generator 101B to the inner coil 109I. The RF power is transmitted from the inner coil 109I and/or outer coil 109O through the window 113 and through the processing region 209 within the plasma processing chamber 111.

Within the processing region 209, the RF power causes the process gas to transform into a plasma 211 in exposure to the substrate 203 supported on the substrate support 201. Also, during operation of the plasma processing chamber 111, exhaust gases and by-product materials from processing of the substrate 203 are exhausted from the plasma processing chamber 111, as indicated by arrow 207. It should be understood that in various embodiments operation of the plasma processing chamber 111 can include many other additional operations, such as generating a bias voltage at the substrate 203 level to attract or repel electrically charged constituents of the plasma 211 toward or away from the substrate 203, and/or controlling a temperature of the substrate 203, and/or applying additional RF power to one or more electrode(s) disposed within the substrate support 201 to generate additional plasma 211, among other additional operations. Also, in various embodiments, the plasma processing chamber 111 is operated in accordance with a prescribed recipe that specifies a temporal schedule for controlling one or more of: supply of process gas(es) to the processing region 209, pressure and temperature within the processing region 209, supply of RF power to the inner coil 109I and/or outer coil 109O, supply of bias voltage at the substrate 203 level, supply of RF power to electrode(s)

within the substrate holder 201, among essentially any other process parameter associated with plasma processing of the substrate 203.

Figure 4:
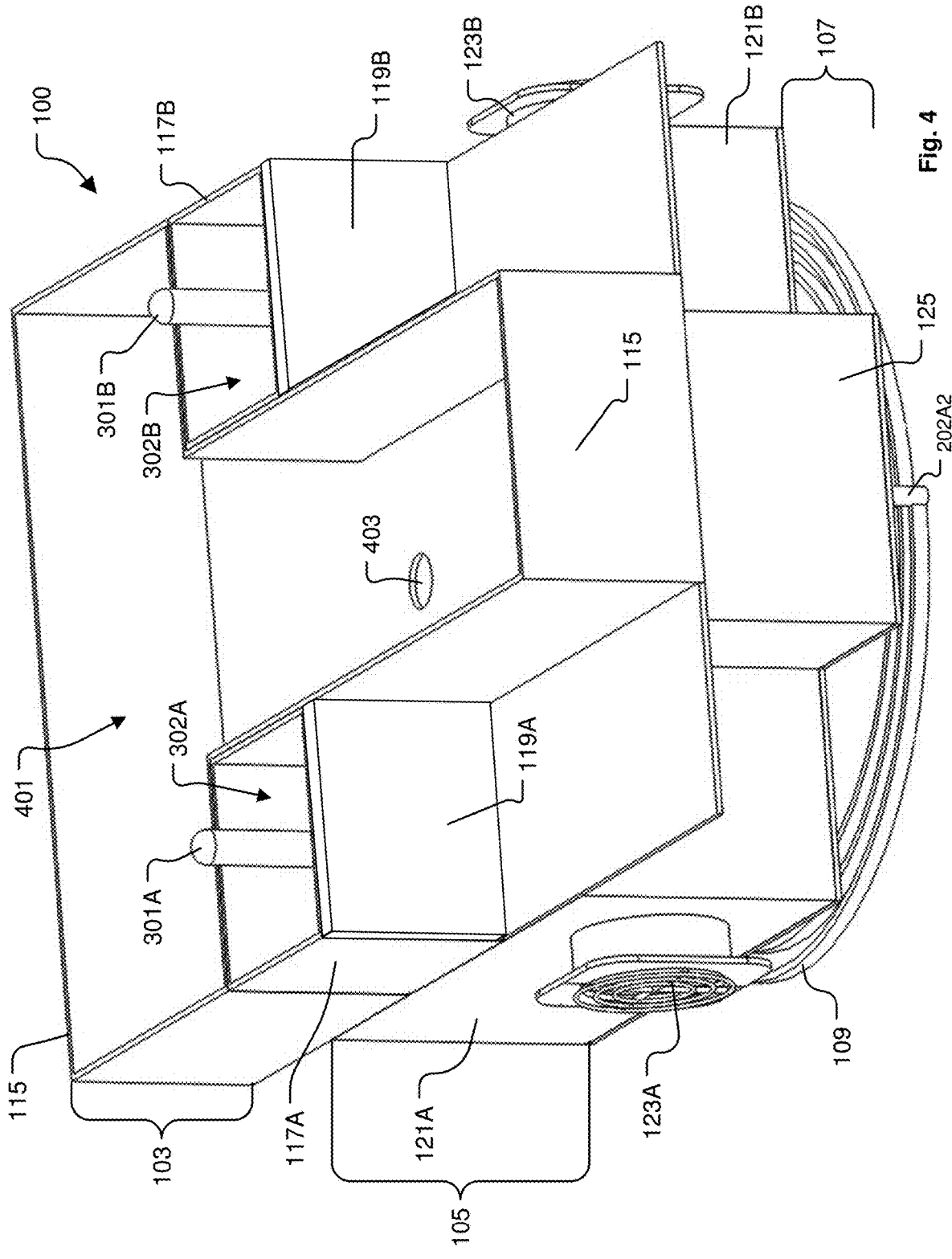
FIG. 4 shows an isometric view of the plasma processing system with the direct-drive RF power supply and the platform removed to reveal the region within the first RF connection enclosure, the region within the second RF connection enclosure, and the T-shaped interior region of the metrology enclosure, in accordance with some embodiments.

FIG. 4 shows an isometric view of the plasma processing system 100 with the direct-drive RF power supply 101 and the platform 114 removed to reveal the region 302A within the first RF connection enclosure 117A, the region 302B within the second RF connection enclosure 117B, and the T-shaped interior region 401 of the metrology enclosure 115, in accordance with some embodiments. As previously mentioned, in various embodiments, metrology equipment such as optical metrology equipment, and/or thermal metrology equipment, and/or electrical metrology equipment, among other types of metrology equipment is/are disposed within the T-shaped interior region 401 of the metrology enclosure 115. In some embodiments, a viewport 403 is formed through the bottom of the metrology enclosure 115 to provide an unobscured line-of-sight view through the window 113 into the processing region 209 within the plasma processing chamber 111. In some embodiments, the viewport 403 is used by an optical metrology device disposed within the interior region 401 of the metrology enclosure 115 to obtain a direct line-of-sight of the plasma 211 generated in the processing region 209 within the plasma processing chamber 111. A first upper RF connection structure 301A extends from the region within the first RF connection enclosure 117A through the platform 114 to connect with an RF supply output of the first direct-drive RF signal generator 101A. The first upper RF connection structure 301A is formed of electrically conductive material over which RF power is readily transmitted. A second upper RF connection structure 301B extends from the region within the second RF connection enclosure 117B through the platform 114 to connect with an RF supply output of the second direct-drive RF signal generator 101B. The second upper RF connection structure 301B is formed of electrically conductive material over which RF power is readily transmitted.

Figure 5:
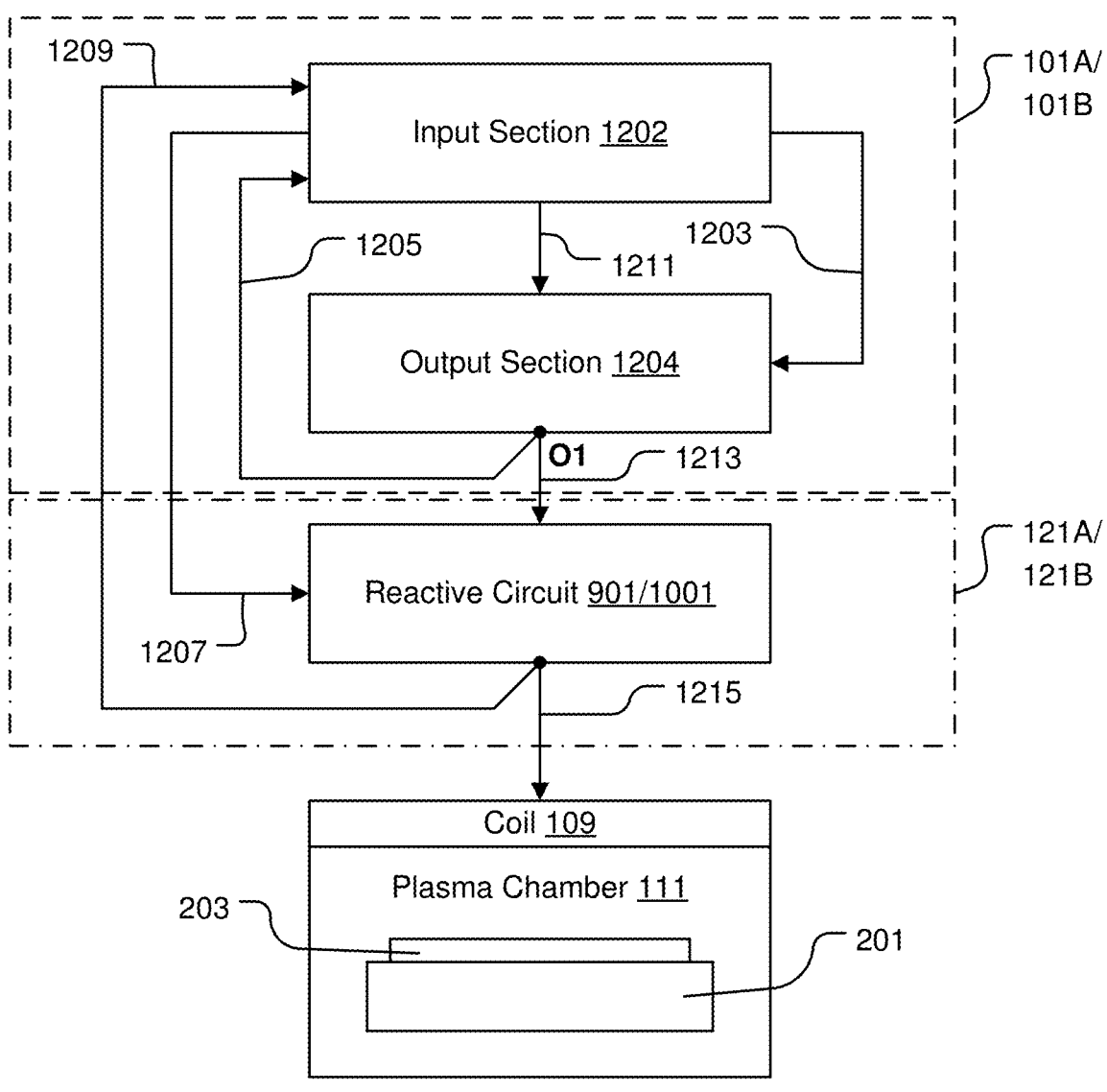
FIG. 5 shows a schematic of how each of the first direct-drive RF signal generator and the second direct-drive RF signal generator is connected through the corresponding first reactive circuit or second reactive circuit to the coil assembly, in accordance with some embodiments.

FIG. 5 shows a schematic of how each of the first direct-drive RF signal generator 101A and the second direct-drive RF signal generator 101B is connected through the corresponding first reactive circuit 901 or second reactive circuit 1001 to the coil assembly 109, in accordance with some embodiments. Each of the first direct-drive RF signal generator 101A and the second direct-drive RF signal generator 101B includes an input section 1202 and an output section 1204. The input section 1202 is electrically connected to the output section 1204, as indicated by the arrow 1211. For the first direct-drive RF signal generator 101A, the output section 1204 is electrically connected to the first reactive circuit 901, as indicated by the arrow 1213. For the second direct-drive RF signal generator 101B, the output section 1204 is electrically connected to the second reactive circuit 1001, as indicated by the arrow 1213. The first reactive circuit 901 is electrically connected to the outer coil 109O, as indicated by the arrow 1215. The second reactive circuit 1001 is electrically connected to the inner coil 109I, as indicated by the arrow 1215.

The input section 1202 includes an electrical signal generator and a portion of a gate driver. The output section 1204 includes a remaining portion of the gate driver and a half-bridge transistor circuit. In some embodiments, the input section 1202 includes a controller board on which the electrical signal generator and the entirety of the gate driver are implemented, with the output section 1204 including the half-bridge transistor circuit. The input section 1202 generates multiple square wave signals and provides the square wave signals to the output section 1204. The output section 1204 generates an amplified square waveform from the multiple square wave signals received from the input section 1202. The output section 1204 also shapes an envelope, such as a peak-to-peak magnitude, of the amplified square waveform. For example, a shaping control signal 1203 is supplied from the input section 1202 to the output section 1204 to generate the envelope. The shaping control signal 1203 has multiple voltage values for shaping the amplified square waveform to generate a shaped-amplified square waveform. For the first direct-drive RF signal generator 101A, the shaped-amplified square waveform is transmitted from the output section 1204 to the first reactive circuit 901. For the second direct-drive RF signal generator 101B, the shaped-amplified square waveform is transmitted from the output section 1204 to the second reactive circuit 1001.

Each of the first reactive circuit 901 and the second reactive circuit 1001 removes, such as filters out, higher-order harmonics of the shaped-amplified square waveform to generate a shaped-sinusoidal waveform having a fundamental frequency. The shaped-sinusoidal waveform has the same envelope as the shaped-amplified square waveform. For the first direct-drive RF signal generator 101A, RF power is transmitted from the first reactive circuit 901 to the outer coil 109O in the form of the shaped-sinusoidal waveform having the fundamental frequency. For the second direct-drive RF signal generator 101B, RF power is transmitted from the second reactive circuit 1001 to the inner coil 109I in the form of the shaped-sinusoidal waveform having the fundamental frequency. RF power transmitted to the inner coil 109I and/or outer coil 109O is transmitted into the plasma processing chamber 111 to transform one or more process gas(es) within the plasma processing chamber 111 into the plasma 211 for processing of the substrate 203, as previously discussed with regard to FIG. 3.

In some embodiments, for the first direct-drive RF signal generator 101A, a reactance of the first reactive circuit 901 is modified by transmitting a quality factor control signal 1207 from the input section 1202 to the first reactive circuit 901, where the quality factor control signal 1207 directs implementation of a specific change in the reactance of the first reactive circuit 901, such as by directing implementation of a change in the capacitance setting of the variable capacitor 801. In some embodiments, for the second direct-drive RF signal generator 101B, a reactance of the second reactive circuit 1001 is modified by transmitting the quality factor control signal 1207 from the input section 1202 to the second reactive circuit 1001, where the quality factor control signal 1207 directs implementation of a specific change in the reactance of the second reactive circuit 1001, such as by directing implementation of a change in the capacitance setting of the variable capacitor 811.

In some embodiments, a feedback signal 1205 is sent from an output O1 of the output section 1204 to the input section 1202. In some embodiments, a phase difference between the time-varying voltage and the time-varying current of the shaped-amplified square waveform output from the output section 1204 is determined from the feedback signal 1205 to enable control of the output section 1204 to reduce or eliminate the phase difference. In some embodiments, for the first direct-drive RF signal generator 101A, in addition to or instead of the feedback signal 1205, an optional feedback signal 1209 is transmitted from the output of the first reactive circuit 901 to the input section 1202. In some embodiments, a phase difference between the time-varying voltage and the time-varying current of the shaped-sinusoidal waveform output from the first reactive circuit 901 is determined from the feedback signal 1209 to enable control of the output section 1204 and/or first reactive circuit 901 to reduce or eliminate the phase difference. In some embodiments, for the second direct-drive RF signal generator 101B, in addition to or instead of the feedback signal 1205, the optional feedback signal 1209 is transmitted from the output of the second reactive circuit 1001 to the input section 1202. In some embodiments, a phase difference between the time-varying voltage and the time-varying current of the shaped-sinusoidal waveform output from the second reactive circuit 1001 is determined from the feedback signal 1209 to enable control of the output section 1204 and/or second reactive circuit 1001 to reduce or eliminate the phase difference.

Figure 6:
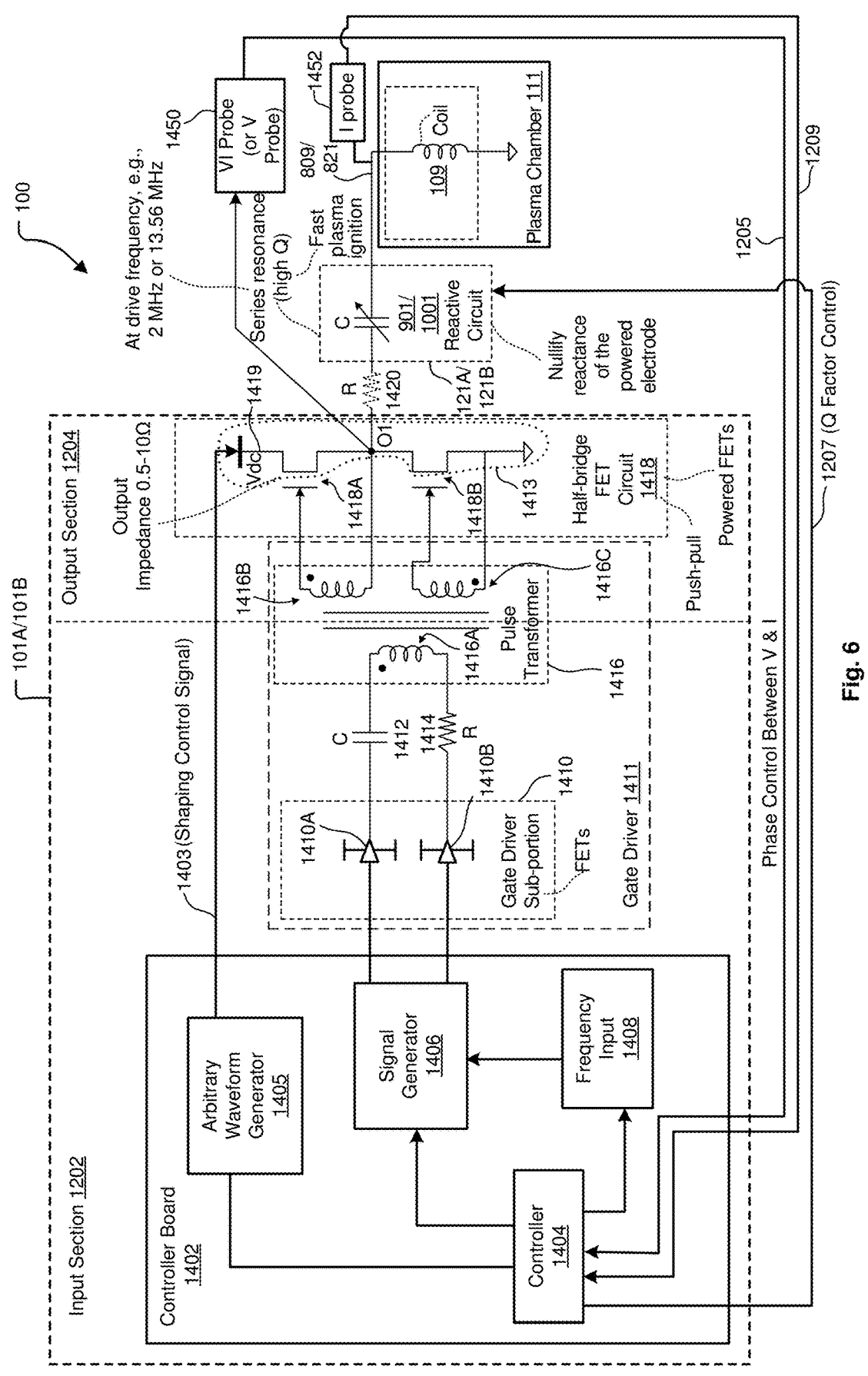
FIG. 6 shows a schematic diagram of each of the first and second direct-drive RF signal generators, in accordance with some embodiments.

FIG. 6 shows a schematic diagram of each of the first and second direct-drive RF signal generators 101A/101B, in accordance with some embodiments. The input section 1202 includes a controller board 1402 and a portion of a gate driver 1411. The gate driver 1411 is coupled to the controller board 1402. The output section 1204 includes the remaining portion of the gate driver 1411 and a half-bridge field effect transistor (FET) circuit 1418. The half-bridge FET circuit 1418 or a tree, described below, is sometimes referred to herein as an amplification circuit and is coupled to the gate driver 1411.

The controller board 1402 includes a controller 1404, a signal generator 1406, and a frequency input 1408. In some embodiments, the controller 1404 includes a processor and a memory device. In some embodiments, the controller 1404 includes one or more of a microprocessor, an application specific integrated circuit (ASIC), a central processing unit, a processor, a programmable logic device (PLD), and a Field Programmable Gate Array (FPGA). The signal generator 1406 is a square wave oscillator that generates a square wave signal, such as a digital waveform or a pulse train. The square wave pulses between a first logic level, such as high (or one), and a second logic level, such as low (or zero). The signal generator 1406 generates the square wave signal at a prescribed operating frequency, such as 400 kiloHertz (kHz), or 2 MHz, or 13.56 MHz, or 27 MHz, or 60 MHz, among other operating frequencies.

The gate driver 1411 includes a first portion, which has a gate driver sub-portion 1410, a capacitor 1412, a resistor 1414, and a primary winding 1416A of a transformer 1416. The gate driver 1411 also includes a second portion (the remaining portion), which includes secondary windings 1416B and 1416C of the transformer 1416. The gate driver sub-portion 1410 includes multiple gate drivers 1410A and 1410B. Each of the gate drivers 1410A and 1410B is coupled to a positive voltage source at one end and to a negative voltage source at its opposite end. The half-bridge FET circuit 1418 includes a FET 1418A and a FET 1418B that are coupled to each other in a push-pull configuration. In some embodiments, such as shown in FIG. 6, the FETs 1418A and 1418B are n-type FETs that turn on when at least a threshold voltage is applied their gate conductor. However, in other embodiments, the FETs 1418A and 1418B are p-type FETs that turn off when at least a threshold voltage is applied their gate conductor. In some embodiments, each of the FET 1418A and the FET 1418B is implemented as a metal oxide semiconductor field effect transistor (MOS-FET). In some embodiments, another type of transistor is used in place of the FETs 1418A and 1418A, such as an insulated gate bipolar transistor (IGBT), or a metal semiconductor field effect transistor (MESFET), or a junction field effect transistor (JFET), among others. In some embodiments, each of the FET 1418A and the FET 1418B is made from silicon carbide, or silicon, or gallium nitride. Each of the FET 1418A and the FET 1418B has an output impedance that lies within a pre-determined range, such as within a range extending from about 0.01 Ohm to about 10 Ohms. In some embodiments, the half-bridge FET circuit 1418 includes a direct current (DC) rail 1413 (illustrated within a dotted section), which includes a voltage source Vdc electrically connected to a first terminal of the FET 1418A through a conductor 1419. A second terminal of the FET 1418A is electrically connected to a first terminal of the FET 1418B. A second terminal of the FET 1418B is electrically connected to a reference ground potential.

In some embodiments, a voltage and current (VI) probe 1450 is coupled to the output O1 of the half-bridge FET circuit 1418. The VI probe 1450 is a sensor that measures a complex current at the output O1, a complex voltage at the output O1, and a phase difference between the complex voltage and the complex current. The complex current has a magnitude and a phase. Similarly, the complex voltage has a magnitude and a phase. The output O1 is between the source terminal of the FET 1418A and the drain terminal of the FET 1418B. The VI probe 1450 is coupled to the controller 1404 to transmit the feedback signal 1209. In some embodiments, a voltage (V) probe 1450 is used in place of the VI probe 1450. In these embodiments, a current (I) probe 1452 is coupled to the output of the first/second reactive circuit 901/1001. The V probe 1450 is a sensor that measures a time-varying complex voltage magnitude and phase at the output O1. The I probe 1452 is a sensor that measures a time-varying complex current magnitude and phase at the output of the first/second reactive circuit 901/1001.

The controller 1404 is coupled to the signal generator 1406 to provide the frequency input 1408, such as the operating frequency, to the signal generator 1406. The controller 1404 is further coupled through a conductor to the voltage source Vdc of the DC rail 1413. The signal generator 1406 is also coupled at its output to the gate drivers 1410A and 1410B. An output of the gate driver 1410A is coupled to the capacitor 1412. An output of the gate driver 1410B is coupled to the resistor 1414. The capacitor 1412 and the resistor 1414 are coupled to opposite ends of the primary winding 1416A of the transformer 1416. The capacitor 312 functions to cancel or negate an inductance of the primary winding 1416A. The cancellation or negation of the inductance of the primary winding 1416A facilitates generation of a square shape of the gate drive signals that are output by the gate drivers 1410A and 1410B. Also, the resistor 1414 reduces an oscillation of the square wave signal that is generated by the signal generator 1406.

A first end of the secondary winding 1416B of the transformer 1416 is electrically connected to a gate terminal of the FET 1418A. A second end of the secondary winding 1416B is electrically connected to both the second terminal of the FET 1418A and the first terminal of the FET 1418B, which are both electrically connected to the output O1 of the half-bridge FET circuit 1418.

A first end of the secondary winding 1416C of the transformer 1416 is electrically connected to a gate terminal of the FET 1418B. A second end of the secondary winding 1416C is electrically connected to the reference ground potential. The output O1 of the half-bridge FET circuit 1418 is electrically connected to the input of the first/second reactive circuit 901/1001. A resistance 1420 is seen by the output O1 of the half-bridge FET circuit 1418. The resistance 1420 represents a combination of the resistance in the portion of the coil assembly 109 to which the first/second direct-drive RF signal generator 101A/101B is connected, the resistance presented by the plasma 211 when present within the plasma processing chamber 111, and the resistance of the RF power transmission path from the output O1 to the coil assembly 109.

The controller 1404 generates a setting, such as the frequency input 1408, and provides the frequency input 1408 to the signal generator 1406. The frequency input 1408 is the value, such as 2 MHz or 13.56 MHz, of the target operating frequency. The signal generator 1406 generates an input RF signal having the target operating frequency upon receiving the setting from the controller 1404. The input RF signal is the square wave signal. The gate drivers 1410A and 1410B amplify the input RF signal to generate an amplified RF signal and provide the amplified RF signal to the primary winding 1416A of the transformer 1416.

Based on a directionality of electrical current flow of the amplified RF signal at a given time, either the secondary winding 1416B or the secondary winding 1416C generates a gate drive signal having a threshold voltage at the given time. For example, when the electrical current of the amplified RF signal flows from a positively charged terminal (indicated by a dot) of the primary winding 1416A to a negatively charged terminal (indicated by the absence of a dot) of the primary winding 1416A, the secondary winding 1416B generates a gate drive signal having at least the threshold voltage to turn on the FET 1418A, and the secondary winding 1416C does not generate the threshold voltage such that the FET 1418B is off. Conversely, when the current of the amplified RF signal flows from the negatively charged terminal (indicated by the absence of the dot) of the primary winding 1416A to the positively charged terminal (indicated by the dot) of the primary winding 1416A, the secondary winding 1416C generates a gate drive signal having at least the threshold voltage to turn on the FET 1418B, and the secondary winding 1416B does not generate the threshold voltage such that the FET 1418A is off.

Each gate drive signal that is transmitted to the gate of the FET 1418A and the gate of the FET 1418B is a square wave signal, e.g., a digital signal or a pulsed signal, having the target operating frequency. For example, each gate drive signal that is transmitted to the gate of the FET 1418A and the gate of the FET 1418B transitions between a low level and a high level. The gate drive signals that are transmitted to the gate of the FET 1418A and the gate of the FET 1418B have the target operating frequency and are in reverse synchronization with respect to each other. More specifically, during a time interval or a time at which the gate drive signal that is transmitted to the gate of the FET 1418A transitions from the low level to the high level, the gate drive signal that is transmitted to the gate of the FET 1418B simultaneously transitions from the high level to the low level. Similarly, during a time interval or a time in which the gate drive signal that is transmitted to the gate of the FET 1418A transitions from the high level to the low level, the gate drive signal that is transmitted to the gate of the FET 1418B simultaneously transitions from the low level to the high level. This reverse synchronization of the gate drive signals allows the FETs 1418A and 1418B to be turned on consecutively and to be turned off consecutively in a repeating manner in accordance with the target operating frequency of the time-varying square wave signal. The FETs 1418A and 1418B are consecutively operated. For example, when the FET 1418A is turned on, the FET 1418B is turned off. And, when the FET 1418B is turned on, the FET 1418A is turned off. The FETs 1418A and 1418B are not on at the same time or during the same time period. At frequencies other than the target operating frequency, the first/second reactive circuit 901/1001 functions to present a high load so that not much current will come out of the first/second direct-drive RF signal generator 101A/101B at the other non-target frequencies.

When the FET 1418A is on and the FET 1418B is off, electrical current flows between the voltage source Vdc and the output O1 to generate a voltage at the output O1. The voltage at the output O1 is generated according to the voltage values received from the controller 1404 or an arbitrary waveform generator 1405, which is further described below. When the FET 1418B is off, there is no electrical current flowing from the output O1 to the ground potential that is coupled to the FET 1418B. Electrical current flows from the voltage source Vdc through the output O1 to the input of the first/second reactive circuit 901/1001 when the FET 1418A is on. Also, when the FET 1418B is on and the FET 1418A is off, electrical current flows from the output O1 to the reference ground potential coupled to the FET 1418B. When the FET 1418A is off, there is no electrical current flowing from the voltage source Vdc to the output O1.

In some embodiments, the controller 1404 directs the arbitrary waveform generator 1405 to generate the shaping control signal 1403 that indicates voltage values. The shaping control signal 1403 is transmitted through an electrical conductor to the voltage source Vdc. The DC rail 1413 is agile in that there is fast control of the voltage source Vdc by the controller 1404 (and, optionally, by the arbitrary waveform generator 1405). Both the controller 1404 and the voltage source Vdc are electronic circuits, which allow the controller 1404 to substantially instantaneously control the voltage source Vdc. For example, at a time the controller 1404 sends (either directly or by way of the arbitrary waveform generator 1405) the voltage values in the shaping control signal 1403 to the voltage source Vdc, the voltage source Vdc substantially instantaneously changes its output voltage level accordingly. In some embodiments, the voltage values indicated by the shaping control signal 1403 are within a range extending from about zero volt to about 80 volts, such that the DC rail 1413 operates within this voltage range. The voltage values indicated by the shaping control signal 1403 are magnitudes of the voltage signal that is generated by the voltage source Vdc to define the shaped envelope of the shaped-amplified square waveform at the output O1 of the output section 1204. For example, when the first/second direct-drive RF signal generator 101A/101B is operated to generate a continuous waveform, the voltage values indicated by the shaping control signal 1403 control, as a function of time, a peak-to-peak magnitude of a parameter of the continuous waveform generated at the output O1 of the output section 1204, where the parameter is one or more of power, voltage, and current, by way of example. The peak-to-peak magnitude of the continuous waveform defines the shaped envelope of the continuous waveform as a function of time.

In another example, when the first/second direct-drive RF signal generator 101A/101B is operated to generate the shaped-amplified square waveform at the output O1 to have a shaped envelope that is pulsed shape, the voltage values indicated by the shaping control signal 1403 are changed substantially instantaneously (in a step-function-like manner) at a given time or during a given pre-determined time period, such that the peak-to-peak magnitude of the shaped-amplified square waveform changes from a first parameter level (e.g., high level) to a second parameter level (e.g., low level) or changes from the second parameter level to the first parameter level, where the parameter is one or more of power, voltage, and current, by way of example. In another example, when the first/second direct-drive RF signal generator 101A/101B is operated to generate the shaped-amplified square waveform at the output O1 to have a shaped envelope that is of arbitrary shape, the voltage values indicated by the shaping control signal 1403 are changed in a prescribed and controlled arbitrary manner as directed by the controller 1404 by way of the arbitrary waveform generator 1405, such that the peak-to-peak magnitude of the shaped-amplified square waveform changes is the prescribed and controlled arbitrary manner. In another example, when the first/second direct-drive RF signal generator 101A/101B is operated to generate the shaped-amplified square waveform at the output O1 to have a multi-state pulsed shape, the voltage values indicated by the shaping control signal 1403 are changed substantially instantaneously (in a step-function-like manner) at a given time or during a given pre-determined time period, such that the peak-to-peak magnitude of the shaped-amplified square waveform changes between different states, where each of the different states has a different peak-to-peak magnitude of particular parameter level, e.g., power level, voltage level, and/or current level, among others. In various embodiments, the number of different states is two or more, as specified by the controller 1404.

The shaped-amplified square waveform generated at the output O1 of the output section 1204 is based on operation (as a function of time) of the FETs 1418A and 1418B in accordance with the gate drive signals as output by the gate drivers 1410A and 1410B, and supply (as a function of time) of voltage by the voltage source Vdc in accordance with the shaping control signal 1403. An amount of amplification of the shaped-amplified square waveform is based on the output impedances of the FETs 1418A and 1418B of the half-bridge FET circuit 1418, the voltage values that are supplied by the controller 1404 (and, optionally, by the arbitrary waveform generator 1405) to the voltage source Vdc, and a maximum achievable voltage value of the voltage source Vdc. The first/second reactive circuit 901/1001 receives the shaped-amplified square waveform and functions to reduce or eliminate the higher-order harmonics of the shaped-amplified square waveform to generate the shaped-sinusoidal waveform having a fundamental frequency. It should be understood that the shaped-sinusoidal waveform that is output by the first/second reactive circuit 901/1001 has the same shaped envelope as the shaped-amplified square waveform that is input to the first/second reactive circuit 901/1001. The shaped-sinusoidal waveform that is output by the first/second reactive circuit 901/1001 is provided to the coil assembly 109 as an RF signal for generation of the plasma 211 within the plasma processing chamber 111.

The VI probe 1450 measures the complex voltage and complex current of the shaped-amplified square waveform at the output O1 and provides the feedback signal 1205 to the controller 1404, where the feedback signal 1205 indicates the complex voltage and complex current. The controller 1404 identifies the phase difference between the complex voltage of the shaped-amplified square waveform and the complex current of the shaped-amplified square waveform from the feedback signal 1205, and determines whether the phase difference is within a predetermined acceptable range. For example, the controller 1404 determines whether or not the phase difference is zero or within a predetermined acceptable range (percentage) away from zero. Upon determining that the phase difference is not within the predetermined acceptable range, the controller 1404 changes frequency values of the operating frequency to change the frequency input 1408. The changed frequency values are provided from the frequency input 1408 to the signal generator 1406 to change the operating frequency of the signal generator 1406. In some embodiments, the operating frequency is changed in less than or equal to about 10 microseconds. The operating frequency of the signal generator 1406 is changed until the controller 1404 determines that the phase difference between the complex voltage and the complex current that is measured by the VI probe 1450 is within the predetermined acceptable range. Upon determining that the phase difference between the complex voltage and the complex current is within the predetermined acceptable range, the controller 1404 does not further change the frequency input 1408. When the phase difference is within the predetermined acceptable range, a predetermined amount of power is provided from the output O1 of the first/second direct-drive RF signal generator 101A/101B through the first/second reactive circuit 901/1001 to the coil assembly 109.

In some embodiments, in addition to or instead of changing the frequency input 1408, the controller 1404 changes the voltage values in the shaping control signal 1403 that is being supplied to the voltage source Vdc in order to change the voltage signal generated by the voltage source Vdc. The voltage source Vdc changes its voltage level in accordance with the voltage values indicated in the shaping control signal 1403. The controller 1404 continues to change the voltage values in the shaping control signal 1403 until the shaped-amplified square waveform achieves a predetermined power setpoint. In some embodiments, the predetermined power setpoint is stored in a memory device of the controller 1404. In various embodiments, instead of changing a voltage of the shaped-amplified square waveform at the output O1, a current of the shaped-amplified square waveform is changed. For example, by directing changes in the voltage values in the shaping control signal 1403, the controller 1404 changes the current of the shaped-amplified square waveform at the output O1 until the shaped-amplified square waveform achieves a predetermined current setpoint. In some embodiments, the predetermined current setpoint is stored in the memory device of the controller 1404. In some embodiments, instead of changing a voltage or a current of the shaped-amplified square waveform at the output O1, a power of the shaped-amplified square waveform is changed. For example, by directing changes in the voltage values in the shaping control signal 1403, the controller 1404 changes the power of the shaped-amplified square waveform at the output O1 until the shaped-amplified square waveform achieves a predetermined power setpoint. In some embodiments, the predetermined power setpoint is stored in the memory device of the controller 1404. It should be noted that any change in the voltage, current, or power of the shaped-amplified square waveform generated at the output O1 produces the same change in the voltage, current, or power, respectively, of the shaped-sinusoidal waveform that is output by the first/second reactive circuit 901/1001.

In some embodiments, the controller 1404 is coupled through a motor driver and a motor (e.g., stepper motor) to the first/second reactive circuit 901/1001. In some embodiments, the motor driver is implemented as an integrated circuit device that includes one or more transistors. The controller 1404 sends a signal, such as the quality factor control signal 1207, to the motor driver to generate an electrical signal that is transmitted from the motor driver to the motor. The motor operates in accordance with the electrical signal received from the motor driver to change a reactance of the first/second reactive circuit 901/1001. For example, in some embodiments, the motor operates to change an area (or spacing) between electrically conducive plates within the capacitor 801/811 to change the reactance of the first/second reactive circuit 901/1001. In some embodiments, the reactance of the first/second reactive circuit 901/1001 is changed to maintain a prescribed quality factor of the first/second reactive circuit 901/1001.

The first/second reactive circuit 901/1001 in combination with an inductance of the outer/inner coil 109O/109I has a high quality factor (Q). For example, an amount of power of the shaped-amplified square waveform generated at the output O1 that is lost in the first/second reactive circuit 901/1001 is low compared to an amount of power of the shaped-sinusoidal waveform that is transmitted from the output of the first/second reactive circuit 901/1001 to the outer/inner coil 109O/109I. The high quality factor of the first/second reactive circuit 901/1001 facilitates fast ignition of the plasma 211 within the plasma processing chamber 111. Also, the first/second reactive circuit 901/1001 is configured and set to resonate out an inductive reactance of the outer/inner coil 109O/109I and the plasma 211, such that the output O1 of the first/second direct-drive RF signal generator 101A/101B sees the resistance 1420 but does not see essentially any reactance. For example, the first reactive circuit 901 is controlled to have a reactance that reduces, such as nullifies or cancels, a reactance of one or more of the outer coil 109O, the plasma 211, and the RF power transmission connections between the first reactive circuit 901 and the outer coil 109O. In some embodiments, the reactance of the first reactive circuit 901 is controlled by controlling the capacitance setting of the variable capacitor 801. Similarly, the second reactive circuit 1001 is controlled to have a reactance that reduces, such as nullifies or cancels, a reactance of one or more of the inner coil 109I, the plasma 211, and the RF power transmission connections between the second reactive circuit 1001 and the inner coil 109I. In some embodiments, the reactance of the second reactive circuit 1001 is controlled by controlling the capacitance setting of the variable capacitor 811.

In some embodiments, the FETs 1418A and 1418B are fabricated from silicon carbide to have a low internal resistance and fast switching time, and to facilitate cooling of the FETs 1418A and 1418B. The low internal resistance of the FETs 1418A and 1418B provides for higher efficiency, which enables the FETs 1418A and 1418B to turn on nearly instantaneously and to turn off fast, such as in less than 10 microseconds. In some embodiments, each of the FETs 1418A and 1418B is configured to turn on and off in less than a pre-determined time period, such as less than 10 microseconds. In some embodiments, each of the FETs 1418A and 1418B is configured to turn on and off in a time period extending from about 0.5 microsecond to about 10 microseconds. In some embodiments, each of the FETs 1418A and 1418B is configured to turn on and off in a time period extending from about 1 microsecond to about 5 microseconds. In some embodiments, each of the FETs 1418A and 1418B is configured to turn on and off in a time period extending from about 3 microseconds to about 7 microseconds. It should be understood that there is essentially no delay in transition between the on and off states for each of the FETs 1418A and 1418B. In this manner, when the FET 1418A turns on, the FET 1418B essentially simultaneously turns off. And, when the FET 1418A turns off, the FET 1418B essentially simultaneously turns on. The FETs

1418A and 1418B are configured to switch on and off fast enough to ensure that the FETs 1418A and 1418B will not be on at the same time in order to avoid electrical current flow directly from the voltage source Vdc to the reference ground potential through the FETs 1418A and 1418B.

The low internal resistance of the silicon carbide FETs 1418A and 1418B reduces an amount of heat generated by the silicon carbide FETs 1418A and 1418B, which makes it easier to cool the silicon carbide FETs 1418A and 1418B using a cooling plate or a heat sink.

It should be understood that the components, such as transistors, of the first/second direct-drive RF signal generator 101A/101B are electronic. Also, it should be understood that there is no RF impedance matching network and RF cable in the RF power transmission path from the first/second direct-drive RF signal generator 101A/101B to the coil assembly 109. The electronic components within the first/second direct-drive RF signal generator 101A/101B in combination with the absence of the RF impedance matching network and RF cable in the RF power transmission path from the first/second direct-drive RF signal generator 101A/101B to the coil assembly 109 provides for repeatability and consistency in regard to fast plasma 211 ignition and plasma 211 sustainability across different plasma processing chambers 111.

Figures 7A, 7B:
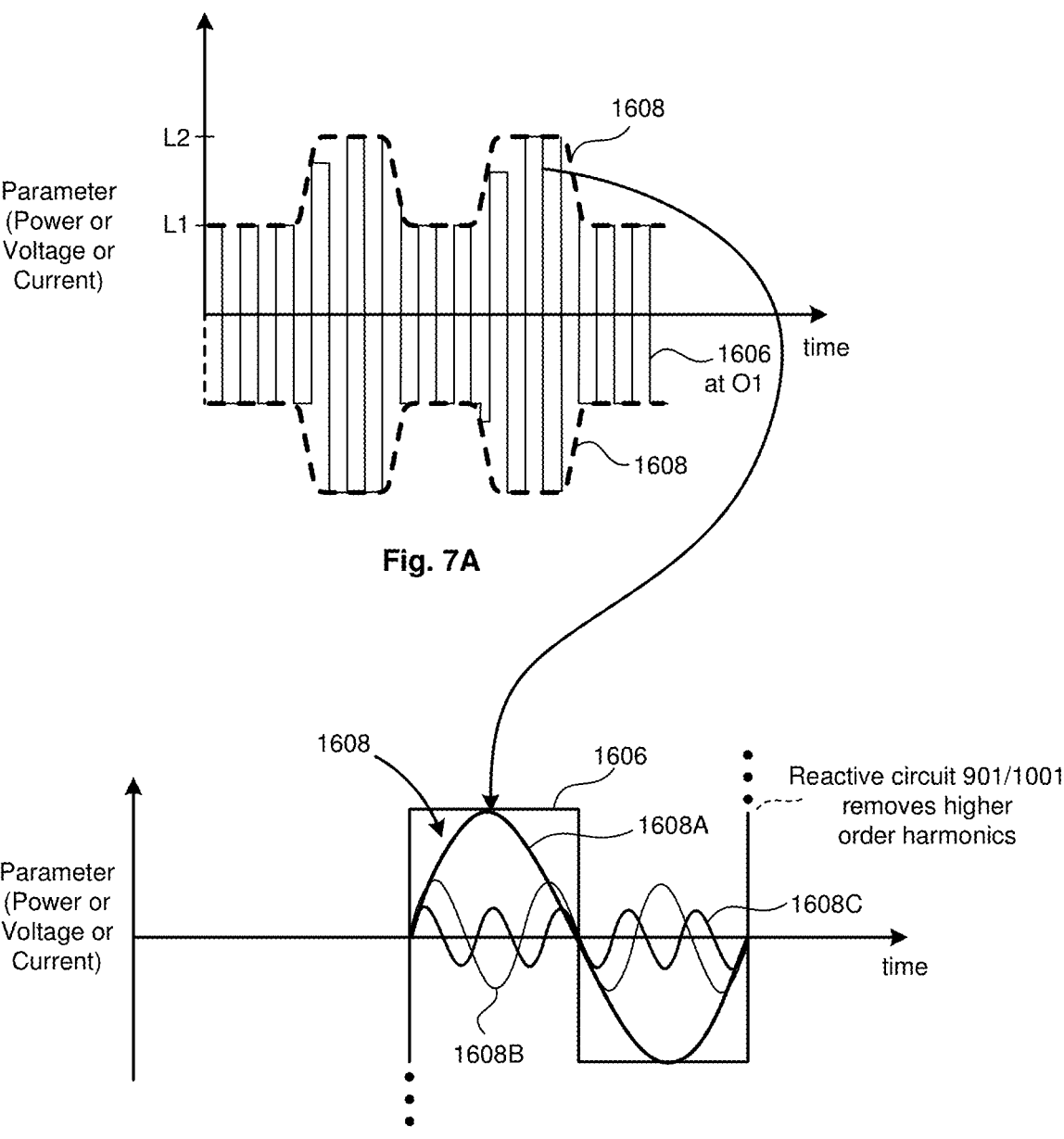
FIG. 7A shows a plot of a parameter of an example shaped-amplified square waveform generated at the output of the first/second direct-drive RF signal generator as a function of time, in accordance with some embodiments.
FIG. 7B shows a plot of a parameter of an example shaped-sinusoidal waveform generated at the output of the first/second reactive circuit as a function of time, in accordance with some embodiments.

FIG. 7A shows a plot of a parameter of an example shaped-amplified square waveform 1606 generated at the output O1 of the first/second direct-drive RF signal generator 101A/101B as a function of time, in accordance with some embodiments. The parameter of the shaped-amplified square waveform 1606 is either power, voltage, or current. The shaped-amplified square waveform 1606 has a shaped envelope 1608 generated in accordance with the voltage values indicated by the shaping control signal 1403 as directed by the controller 1404 and/or arbitrary waveform generator 1405. The shaped envelope 1608 is controlled so that an absolute magnitude of the parameter of the shaped-amplified square waveform 1606 transitions between a first level L1 (lower level) and a second level L2 (higher level). The parameter has a lower peak-to-peak magnitude at the first level L1 than at the second level L2. It should be understood that the shaped envelope 1608 can have a different shape than what is shown in FIG. 7A, depending on the voltage values indicated by the shaping control signal 1403. For example, the shaping control signal 1403 can be generated to direct the shaped envelope 1608 to have a continuous wave shape, a triangular shape, a multi-level pulse shape, or essentially any other prescribed controlled arbitrary shape.

FIG. 7B shows a plot of a parameter of an example shaped-sinusoidal waveform 1608 generated at the output of the first/second reactive circuit 901/1001 as a function of time, in accordance with some embodiments. The parameter of the shaped-sinusoidal waveform 1608 is either power, voltage, or current. The shaped-sinusoidal waveform 1608 is based on the shaped-amplified square waveform 1606 that is input to the first/second reactive circuit 901/1001 as a function of time. The shaped-amplified square waveform 1606 is a combination of a fundamental frequency sinusoidal waveform 1608A and multiple higher-order harmonic frequency sinusoidal waveforms 1608B, 1608C, etc. For example, the sinusoidal waveform 1608B represents a second order harmonic frequency of the fundamental frequency sinusoidal waveform 1608A. And, the sinusoidal waveform 1608C represents a third order harmonic frequency of the fundamental frequency sinusoidal waveform 1608A. The first/second reactive circuit 901/1001 functions to remove the higher-order harmonic frequency sinusoidal waveforms 1608B, 1608C from the shaped-amplified square waveform 1606, so that just the fundamental frequency sinusoidal waveform 1608A is provided at the output of the first/second reactive circuit 901/1001 as a function of time. The high quality factor of the first/second reactive circuit 901/1001 facilitates removal of the higher-order harmonic frequency sinusoidal waveforms 1608B, 1608C, etc. from the shaped-amplified square waveform 1606 that is output by the first/second direct-drive RF signal generator 101A/101B. The fundamental frequency sinusoidal waveform 1608A is transmitted as the shaped-sinusoidal waveform 1608 to the coil assembly 109, thereby transmitting RF power to the coil assembly 109.

Figure 8A:
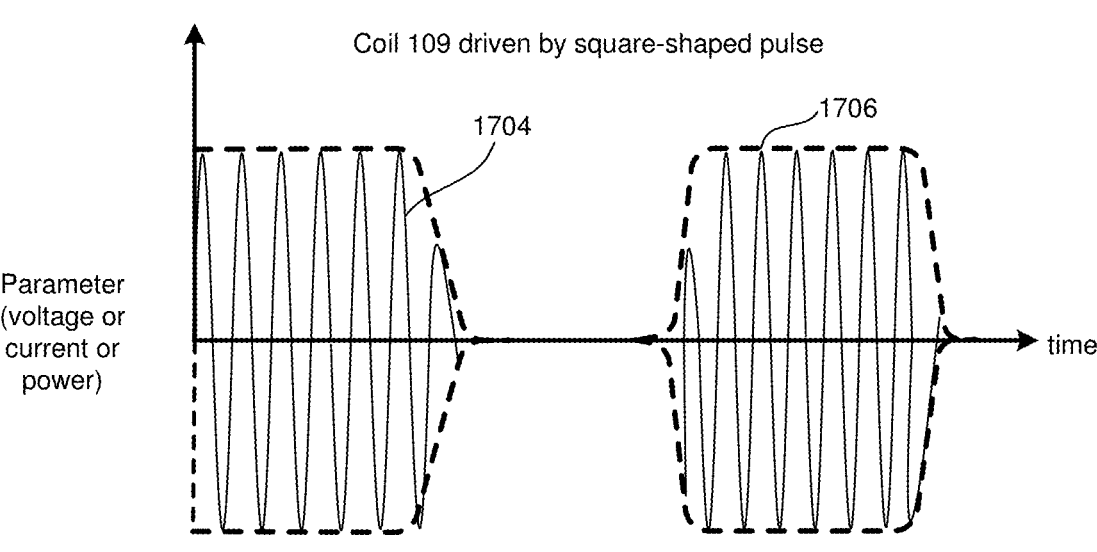
FIG. 8A shows a plot of a parameter of an example shaped-sinusoidal waveform generated at the output of the first/second reactive circuit as a function of time, in accordance with some embodiments.

FIG. 8A shows a plot of a parameter of an example shaped-sinusoidal waveform 1704 generated at the output of the first/second reactive circuit 901/1001 as a function of time, in accordance with some embodiments. The parameter of the shaped-sinusoidal waveform 1704 is cither power, voltage, or current. The shaped-sinusoidal waveform 1704 has a shaped envelope 1706 generated in accordance with the voltage values indicated by the shaping control signal 1403 as directed by the controller 1404 and/or arbitrary waveform generator 1405. The shaped envelope 1706 defines a peak-to-peak change in the parameter of the shaped-sinusoidal waveform 1704 as a function of time. The example shaped envelope 1706 represents a square-shaped envelope, such as a pulse shaped envelope.

Figure 8B:
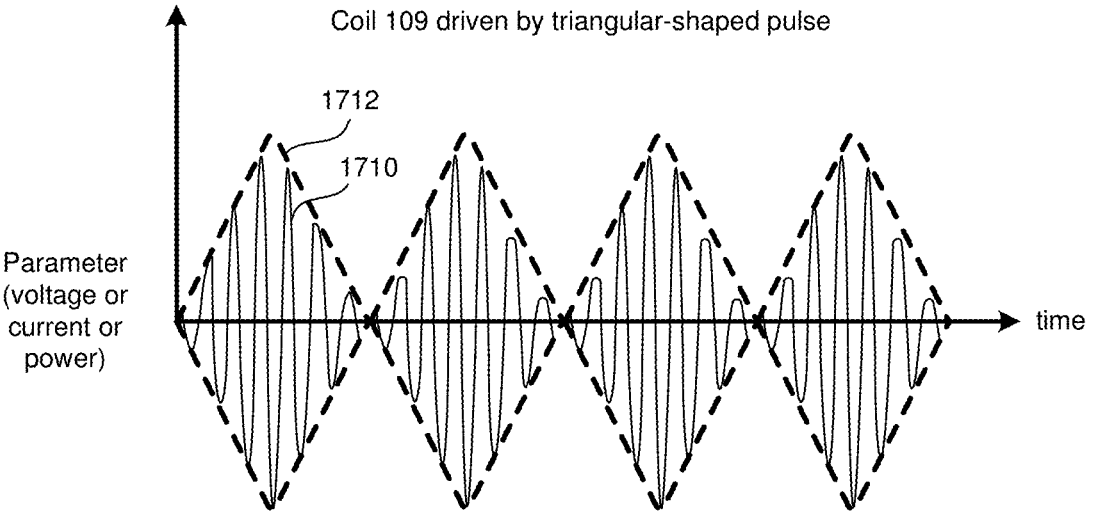
FIG. 8B shows a plot of a parameter of an example shaped-sinusoidal waveform generated at the output of the first/second reactive circuit as a function of time, in accordance with some embodiments.

FIG. 8B shows a plot of a parameter of an example shaped-sinusoidal waveform 1710 generated at the output of the first/second reactive circuit 901/1001 as a function of time, in accordance with some embodiments. The parameter of the shaped-sinusoidal waveform 1710 is cither power, voltage, or current. The shaped-sinusoidal waveform 1710 has a shaped envelope 1712 generated in accordance with the voltage values indicated by the shaping control signal 1403 as directed by the controller 1404 and/or arbitrary waveform generator 1405. The shaped envelope 1712 defines a peak-to-peak change in the parameter of the shaped-sinusoidal waveform 1710 as a function of time. The example shaped envelope 1710 represents a triangular-shaped envelope.

Figure 8C:
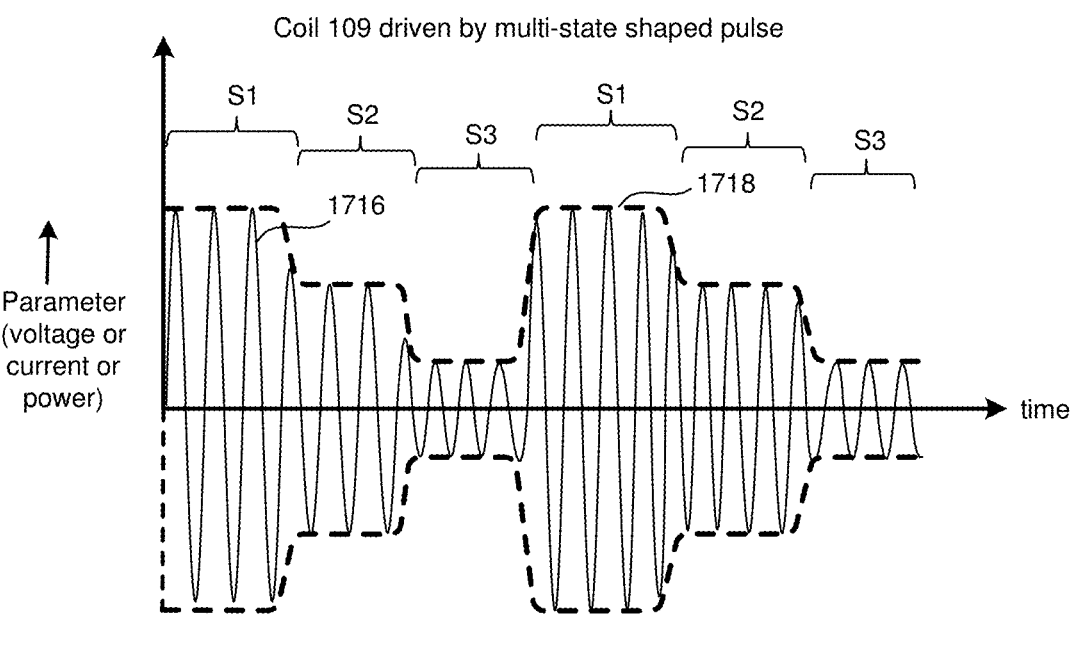
FIG. 8C shows a plot of a parameter of an example shaped-sinusoidal waveform generated at the output of the first/second reactive circuit as a function of time, in accordance with some embodiments.

FIG. 8C shows a plot of a parameter of an example shaped-sinusoidal waveform 1716 generated at the output of the first/second reactive circuit 901/1001 as a function of time, in accordance with some embodiments. The parameter of the shaped-sinusoidal waveform 1716 is either power, voltage, or current. The shaped-sinusoidal waveform 1716 has a shaped envelope 1718 generated in accordance with the voltage values indicated by the shaping control signal 1403 as directed by the controller 1404 and/or arbitrary waveform generator 1405. The shaped envelope 1718 defines a peak-to-peak change in the parameter of the shaped-sinusoidal waveform 1716 as a function of time. The example shaped envelope 1718 represents a multi-state shaped envelope that includes three different states S1, S2, and S3. The shaped envelope 1718 is defined so that the peak-to-peak change in the parameter of the shaped-sinu-soidal waveform 1716 during the first state S1 is greater than the peak-to-peak change in the parameter of the shaped-sinusoidal waveform 1716 during the first state S2. The shaped envelope 1718 is also defined so that the peak-to-peak change in the parameter of the shaped-sinusoidal waveform 1716 during the second state S2 is greater than the peak-to-peak change in the parameter of the shaped-sinu-soidal waveform 1716 during the third state S3. The shaped envelope 1718 revert back to the first state S1 after the third state S3. The states S1, S2, and S3 repeat at a frequency that is less than the frequency of the shaped-amplified square waveform that is output by the first/second direct-drive RF signal generator 101A/101B. Therefore, the states S1, S2, and S3 repeat at a frequency that is less than the frequency of the shaped-sinusoidal waveform 1716. In various embodiments, the multi-state shaped envelope includes more than three different states, with each different state corresponding to a different peak-to-peak change in the parameter of the shaped-sinusoidal waveform 1716 as a function of time. Also, in various embodiments, the multi-state shaped envelope can be controlled so that any of the three or more different states of the shaped envelope has cither a lower or higher peak-to-peak magnitude of the parameter of the shaped-sinusoidal waveform 1716 relative to a next state of the shaped envelope.

Figure 8D:
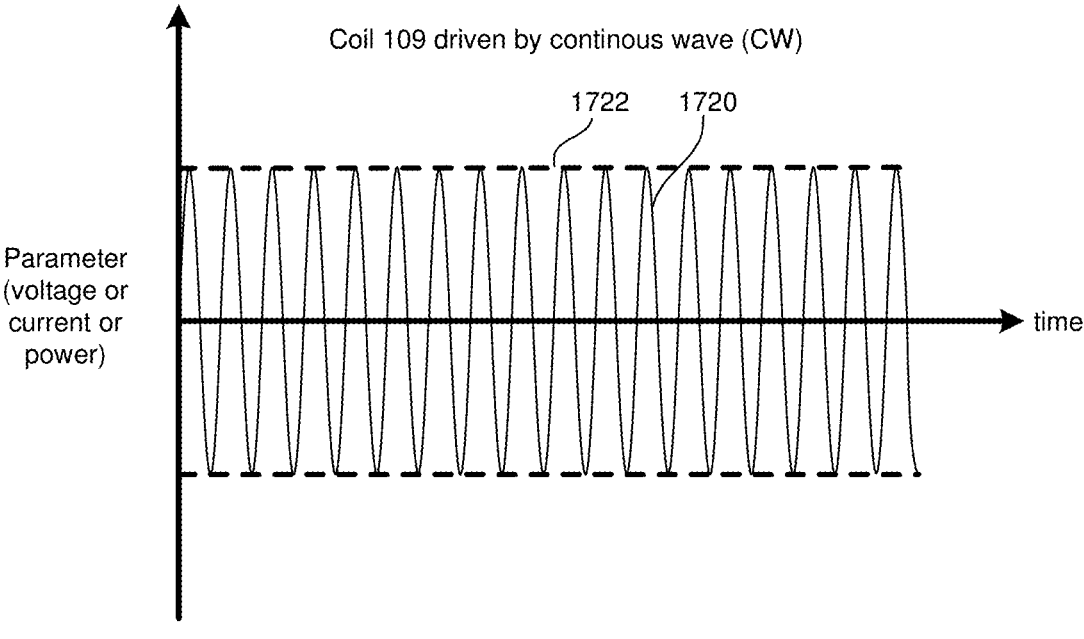
FIG. 8D shows a plot of a parameter of an example shaped-sinusoidal waveform generated at the output of the first/second reactive circuit as a function of time, in accordance with some embodiments.

FIG. 8D shows a plot of a parameter of an example shaped-sinusoidal waveform 1720 generated at the output of the first/second reactive circuit 901/1001 as a function of time, in accordance with some embodiments. The parameter of the shaped-sinusoidal waveform 1720 is cither power, voltage, or current. The shaped-sinusoidal waveform 1720 has a shaped envelope 1722 generated in accordance with the voltage values indicated by the shaping control signal 1403 as directed by the controller 1404 and/or arbitrary waveform generator 1405. The shaped envelope 1722 defines a peak-to-peak change in the parameter of the shaped-sinusoidal waveform 1720 as a function of time. The example shaped envelope 1722 is flat, such that shaped-sinusoidal waveform 1720 represents a continuous wave signal.

Figure 9A:
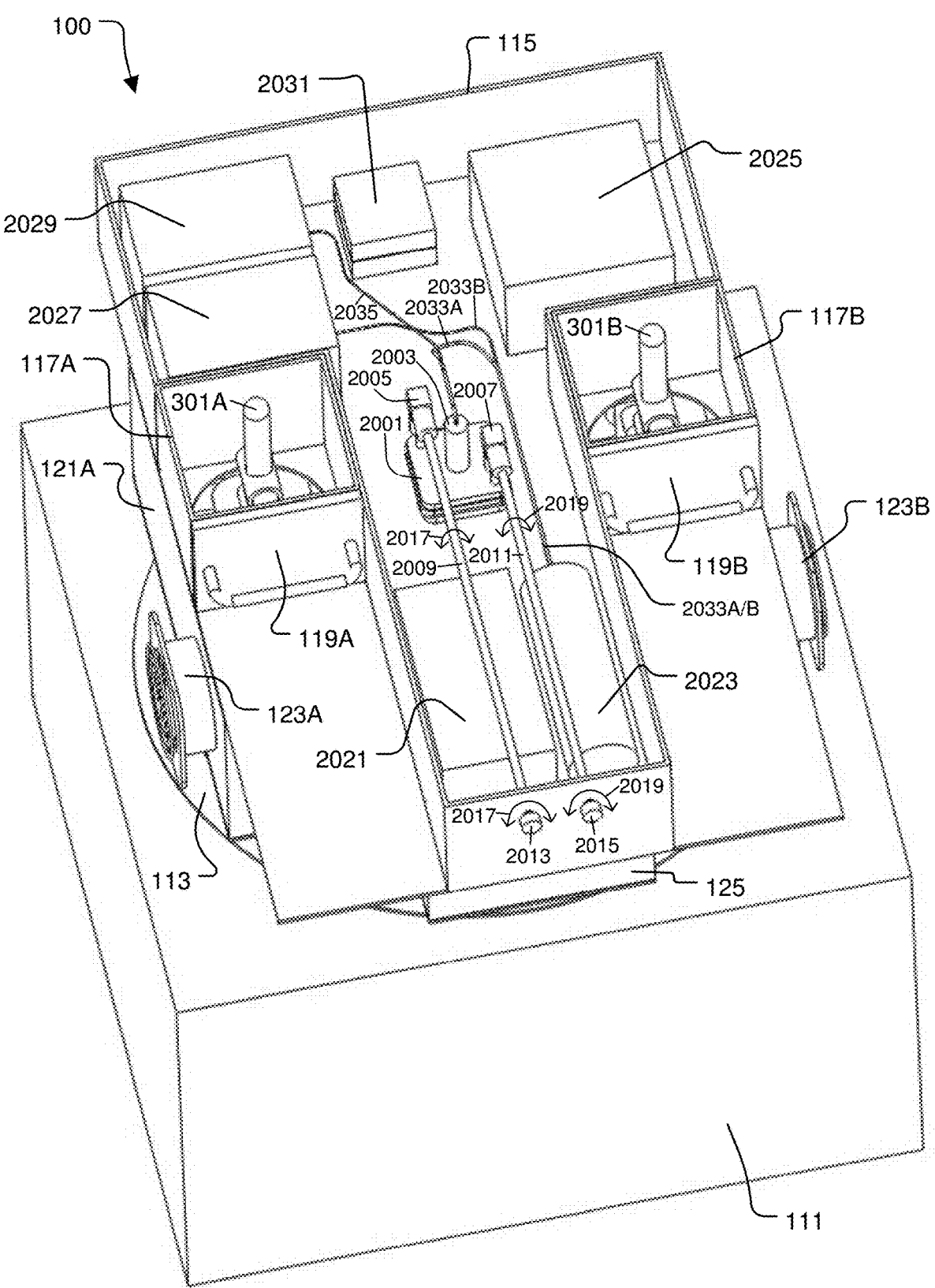
FIG. 9A shows the plasma processing system with an open view of the metrology enclosure and with an example spectral reflectometry system disposed within the metrology enclosure, in accordance with some embodiments.

FIG. 9A shows the plasma processing system 100 with an open view of the metrology enclosure 115 and with an example spectral reflectometry system disposed within the metrology enclosure 115, in accordance with some embodi-ments. The example spectral reflectometry system includes an optical collimator 2003 positioned to direct a beam of light 2037 (see FIG. 9C) through an opening in the metrol-ogy enclosure 115 (e.g., the viewport 403), an opening in the coil connection enclosure 125, and the window 113 (upper window 113) into the plasma processing chamber 111. The optical collimator 2003 is also configured to receive reflected light 2039 (see FIG. 9C) from within the plasma processing chamber 111, where the reflected light 2039 passes through the window 113, and through the opening in the coil connection enclosure 125, and through the opening in the metrology enclosure 115.

In some embodiments, the spectral reflectometry system within the metrology enclosure 115 includes a lamp 2023 (e.g., a flash lamp), a power supply 2021, a first spectrometer 2027, a second spectrometer 2029, spectrometer electronics 2031, a control system 2025, and an orientation control stage 2001 for the optical collimator 2003. In some embodiments, the spectral reflectometry system within the metrology enclosure 115 also includes an optical fiber 2033A having a first end optically connected to an optical output of the lamp 2023 and a second end optically connected to the optical collimator 2003. Light is transmitted from the lamp 203 through the optical fiber 2033A to the optical collimator 2003 to form the beam of light 2037 (see FIG. 9C). In some embodiments, the spectral reflectometry system within the metrology enclosure 115 also includes an optical fiber 2033B having a first end optically connected to the optical output of the lamp 2023 and a second end optically con-nected to the first spectrometer 2027. The light transmitted from the lamp 203 travels through the optical fiber 2033B to the first spectrometer 2027. In some embodiments, the spectral reflectometry system within the metrology enclosure 115 also includes an optical fiber 2035 having a first end optically connected to the optical collimator 2003 and a second end optically connected to the second spectrometer 2029. The reflected light 2039 (see FIG. 9C) is conveyed through the optical fiber 2035 to the second spectrometer 2029. In some embodiments, the spectral reflectometry system within the metrology enclosure 115 also includes an optical polarization control device and/or other optical device(s) and/or other electro-optic device(s) and/or other electrical device(s).

In some embodiments, the optical collimator 2003 is configured to change a diameter of the light received from the optical fiber 2033A to collimate a substantially parallel beam of light 2037 onto the substrate 203 in the plasma processing chamber 111. The optical collimator 2003 is also configured to focus the reflected light 2039 into the optical fiber 2035. In various embodiments, the optical collimator 2003 includes one or more optical lenses. When the beam of light 2037 is incident upon the substrate 203, the substrate 203 reflects back part of the light as the reflected light 2039. The spectrometer 2029 measures the spectrum of the reflected light 2039. The spectrometer 2027 measures the spectrum of the incident beam of light 2037. In various embodiments, a control system uses the spectra measured by the first spectrometer 2027 and/or the second spectrometer 2029 to determine a thickness of a film on the substrate 203, and/or an etch rate on the substrate 203, and/or a deposition rate on the substrate 203, and/or the existence of an endpoint condition for the plasma processing operation performed on the substrate 203, and/or another plasma processing related parameter of interest.

In some embodiments, the orientation control stage 2001 for the optical collimator 2003 includes a tip adjustment device for controlling a tip angle 2002 (see FIG. 9D) of the optical collimator 2003 within a first vertical reference plane (parallel to y-z reference plane). Also, in these embodiments, the orientation control stage 2001 includes a tilt adjustment device for controlling a tilt angle 2004 (see FIG. 9D) of the optical collimator 2003 within a second vertical reference plane (parallel to the x-z reference plane), where the second vertical reference plane is perpendicular to the first vertical reference plane. Also, in some embodiments, a position of the orientation control stage 2001 is adjustable within a horizontal reference plane (parallel to the x-y reference plane) relative to the metrology enclosure 115. In some embodiments, the position of the orientation control stage 2001 within the horizontal reference plane is remotely adjustable. In some embodiments, the orientation control stage 2001 is positioned within the horizontal reference plane such that the optical collimator 2003 is substantially centered upon the substrate 203 (see FIG. 9C) within the plasma processing chamber 111.

Figure 9B:
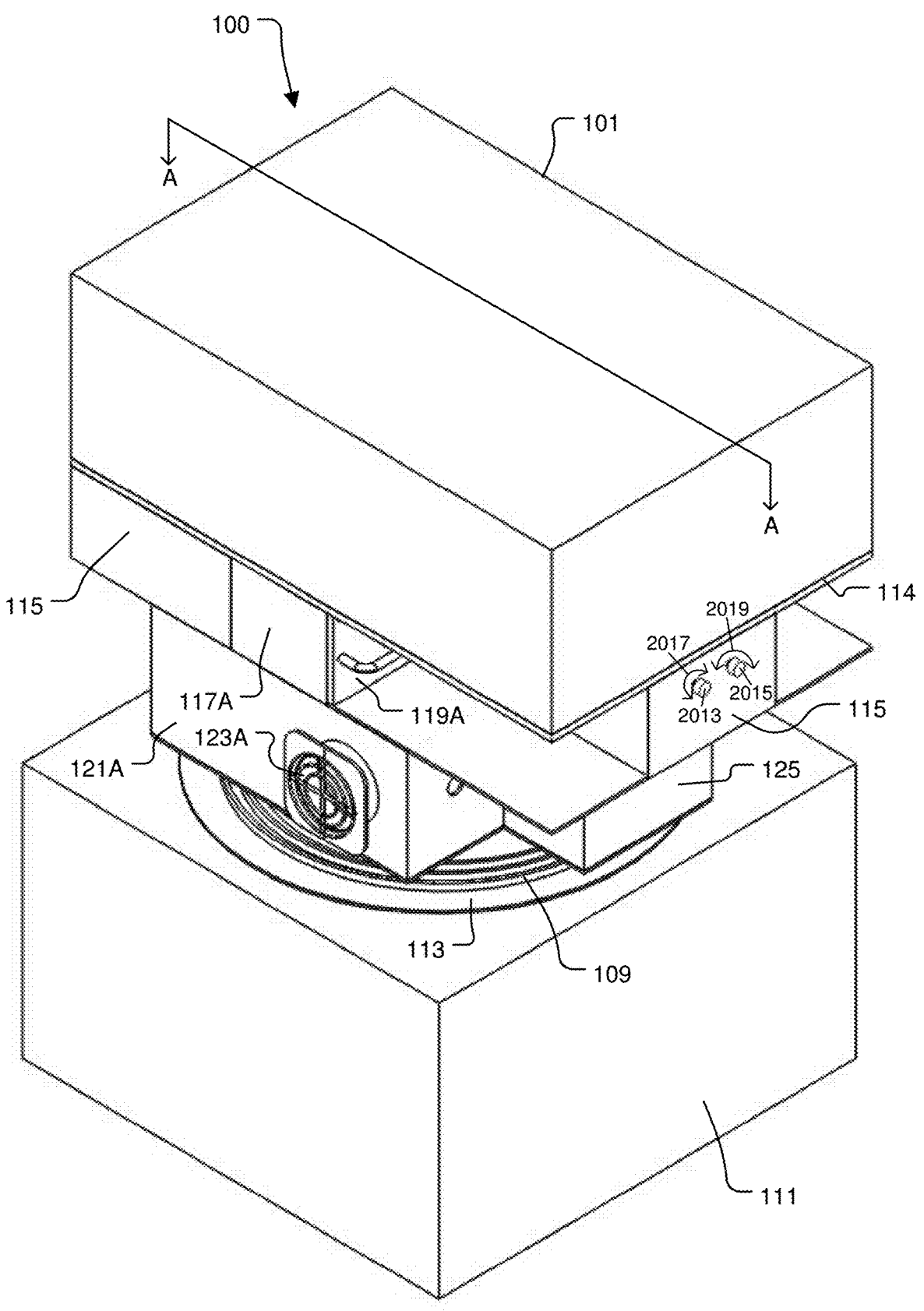
FIG. 9B shows an isometric view of the plasma processing system with the spectral reflectometry system disposed within the metrology enclosure, in accordance with some embodiments.
Figure 9C:
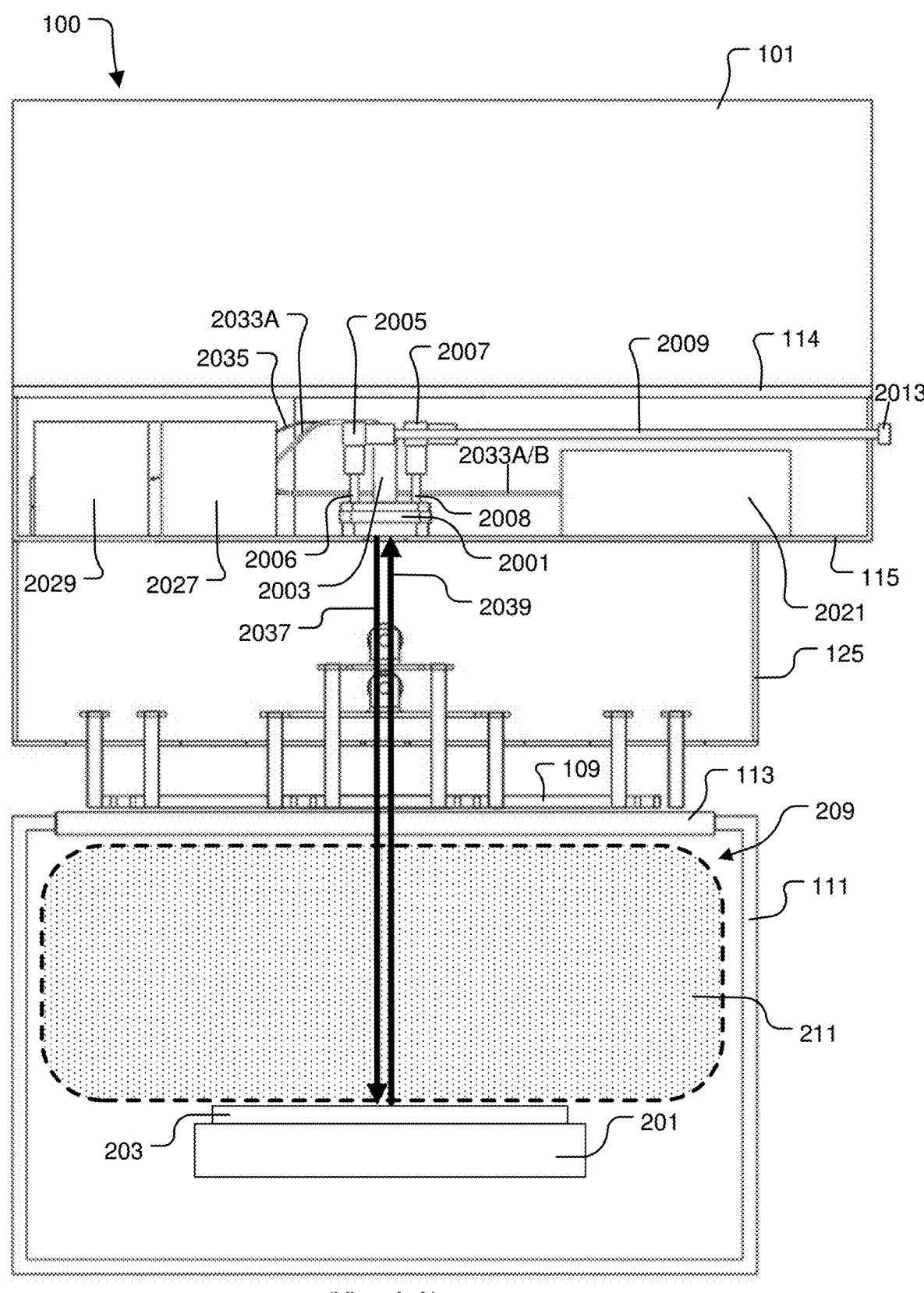
FIG. 9C shows a vertical cut-away view of the plasma processing system, referenced as View A-A in FIG. 9B, with the spectral reflectometry system disposed within the metrology enclosure, in accordance with some embodiments.
Figure 9D:
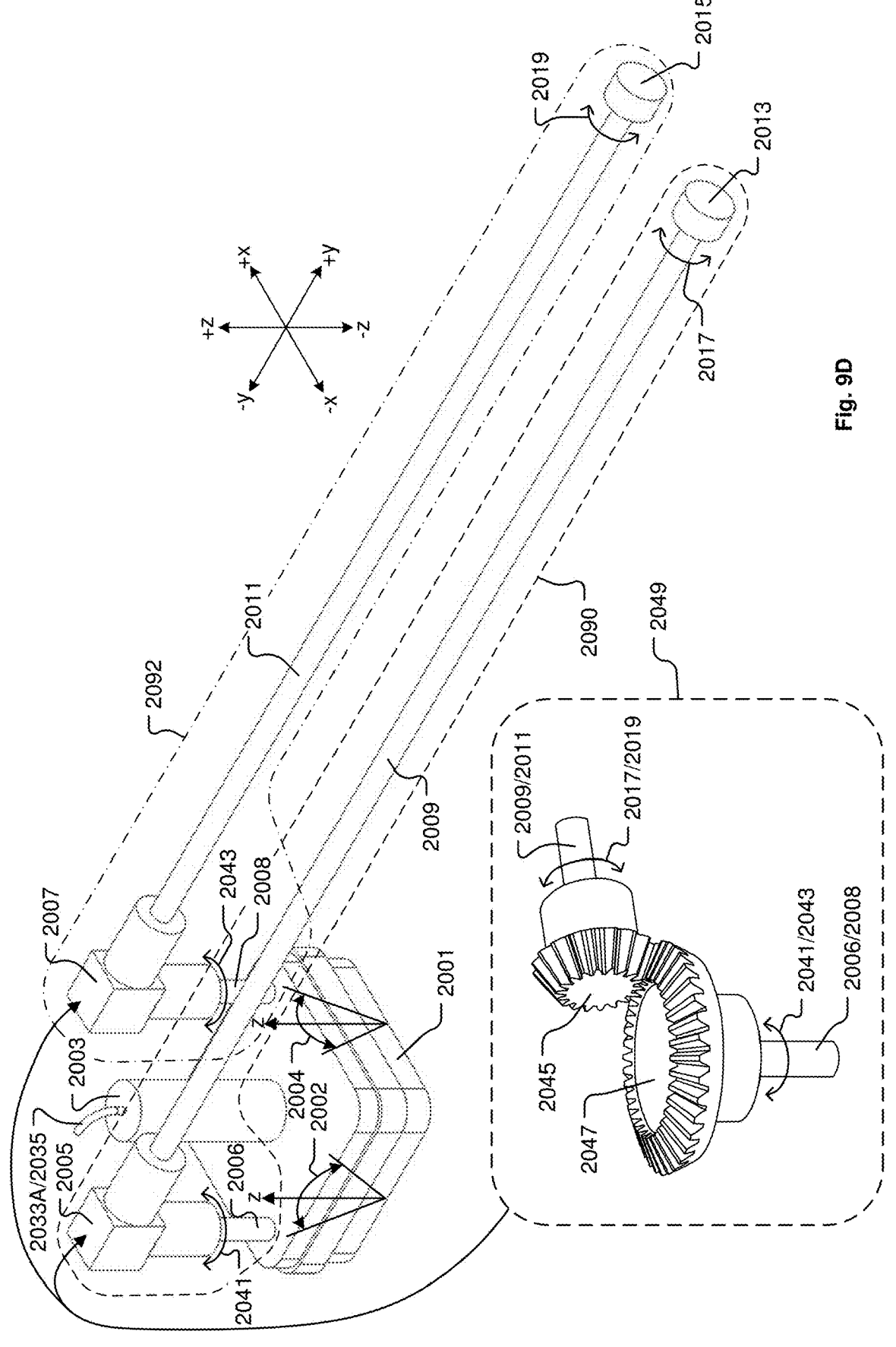
FIG. 9D shows an isolated view of the orientation control stage of the optical collimator connected to a first adjustment mechanism and a second adjustment mechanism, in accordance with some embodiments.

FIG. 9B shows an isometric view of the plasma processing system 100 with the spectral reflectometry system disposed within the metrology enclosure 115, in accordance with some embodiments. FIG. 9C shows a vertical cut-away view of the plasma processing system 100, referenced as View A-A in FIG. 9B, with the spectral reflectometry system disposed within the metrology enclosure 115, in accordance with some embodiments. FIG. 9D shows an isolated view of the orientation control stage 2001 of the optical collimator 2003 connected to a first adjustment mechanism 2090 and a second adjustment mechanism 2092, in accordance with some embodiments. The first adjustment mechanism 2090 extends from outside of the metrology enclosure 115 to the tip adjustment device. In some embodiments, the first adjustment mechanism 2090 includes a first rod 2009 extending from a first location outside of the metrology enclosure 115 to a first rotational transfer device 2005 that is configured to translate rotation of the first rod 2009, as indicated by arrow 2017, into rotation of a first screw 2006, as indicated by arrow 2041. Rotation of the screw 2006 causes a change in the tip angle 2002 of the orientation control stage 2001 of the optical collimator 2003. The second adjustment mechanism 2092 extends from outside of the metrology enclosure 115 to the tilt adjustment device. In some embodiments, the second adjustment mechanism 2092 includes a second rod 2011 extending from a second location outside of the metrology enclosure 115 to a second rotational transfer device 2007 that is configured to translate rotation of the second rod 2011, as indicated by arrow 2019, into rotation of a second screw 2008, as indicated by arrow 2043. Rotation of the screw 2008 causes a change in the tilt angle 2004 of the orientation control stage 2001 of the optical collimator 2003.

A portion 2049 of FIG. 9D shows an example of how each of the first rotational transfer device 2005 and the second rotational transfer device 2007 is implemented as a respective gear box to translate rotation of the rods 2009/2011 into rotation of the screws 2006/2008. In this example, a first bevel gear 2045 is connected to the rod 2009/2001 inside the first/second rotational transfer device 2005/2007, and a second bevel gear 2047 is connected to the screw 2006/2008 inside the first/second rotational transfer device 2005/2007. The first bevel gear 2045 and the second bevel gear 2047 are configured to mesh together such that rotation of the first bevel gear 2045, as indicated by arrow 2017/2019, causes rotation of the second bevel gear 2047, as indicated by arrow 2041/2043. It should be understood, however, that the configuration of the first bevel gear 2045 and the second bevel gear 2047 represents one example of many possible ways in which the first rotational transfer device 2005 and the second rotational transfer device 2007 can be implemented in various embodiments. For example, in other embodiments, the first rotational transfer device 2005 and the second rotational transfer device 2007 can be implemented using different types and arrangements of gears and/or pulleys, so long as controlled rotation of the rods 2009/2001 causes corresponding controlled rotation of the screws 2006/2008 to in turn cause controlled adjustment of the tip/tilt angles 2002/2004.

In some embodiments, the first adjustment mechanism 2090 is configured to provide for manual adjustment of the tip angle 2002 of the optical collimator 2003 from the first location outside of the metrology enclosure 115. In some embodiments, a first adjustment control 2013 is connected to the first rod 2009 at the first location outside of the metrology enclosure 115. The first adjustment control 2013 is configured to enable manual rotation of the first rod 2009. Also, in some embodiments, the first adjustment control 2013 is configured to enable locking of the first rod 2009 at a desired rotational position. Also, in some embodiments, the second adjustment mechanism 2092 is configured to provide for manual adjustment of the tilt angle 2004 of the optical collimator 2003 from the second location outside of the metrology enclosure 115. In some embodiments, a first stepper motor is mechanically linked to the first adjustment control 2013 to provide for automated and remote adjustment of the tip angle 2002 of the optical collimator 2003.

In some embodiments, a second adjustment control 2015 is connected to the second rod 2011 at the second location outside of the metrology enclosure 115. The second adjustment control 2015 is configured to enable manual rotation of the second rod 2011. Also, in some embodiments, the second adjustment control 2015 is configured to enable locking of the second rod 2011 at a desired rotational position. Also, in some embodiments, a second stepper motor is mechanically linked to the second adjustment control 2015 to provide for automated and remote adjustment of the tilt angle 2004 of the optical collimator 2003.

Figure 10A:
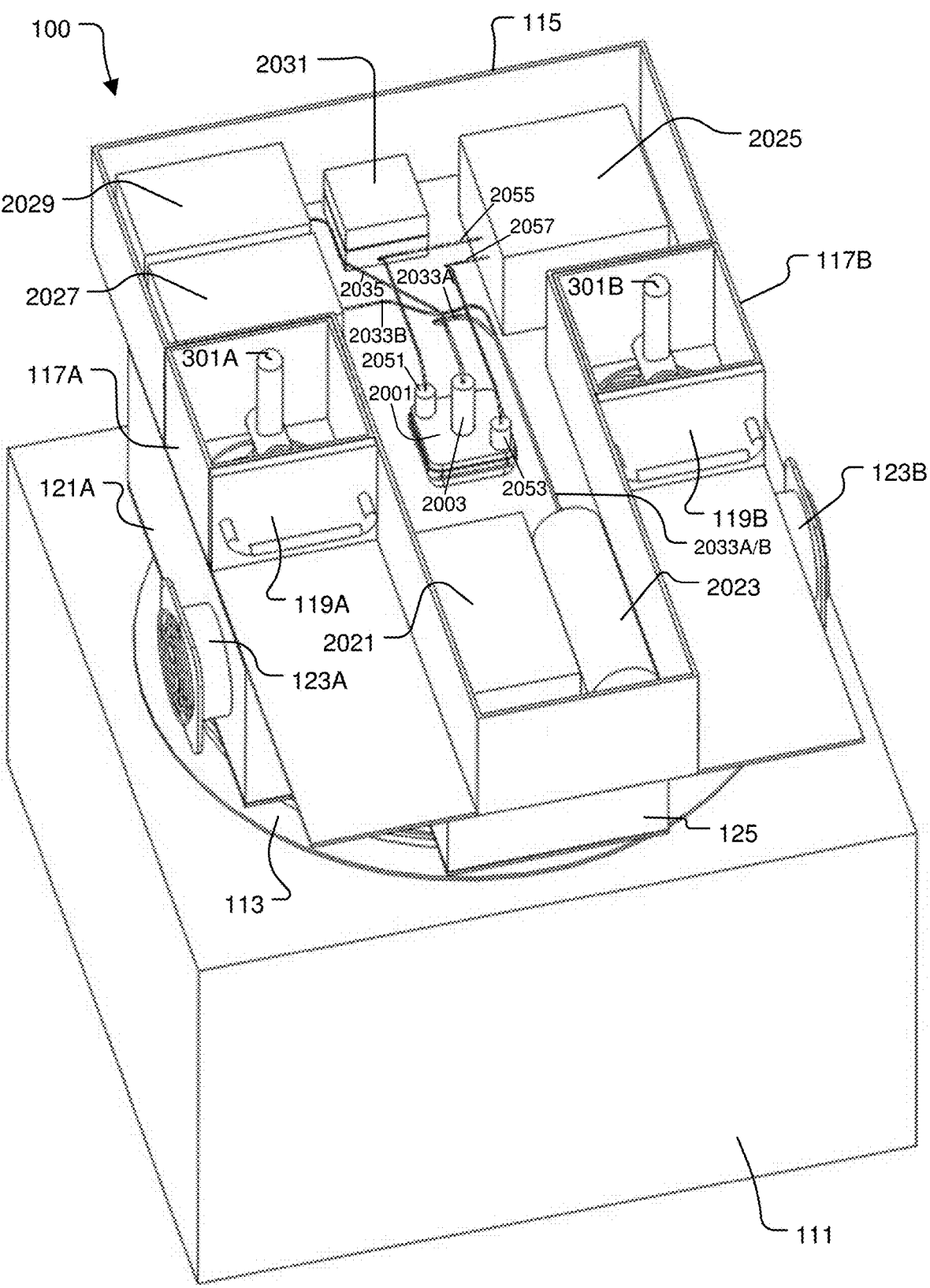
FIG. 10A shows the plasma processing system with an open view of the metrology enclosure and with the example spectral reflectometry system disposed within the metrology enclosure, where the spectral reflectometry system includes a first motorized adjustment mechanism and a second motorized adjustment mechanism connected to the orientation control stage for the optical collimator, in accordance with some embodiments.
Figure 10B:
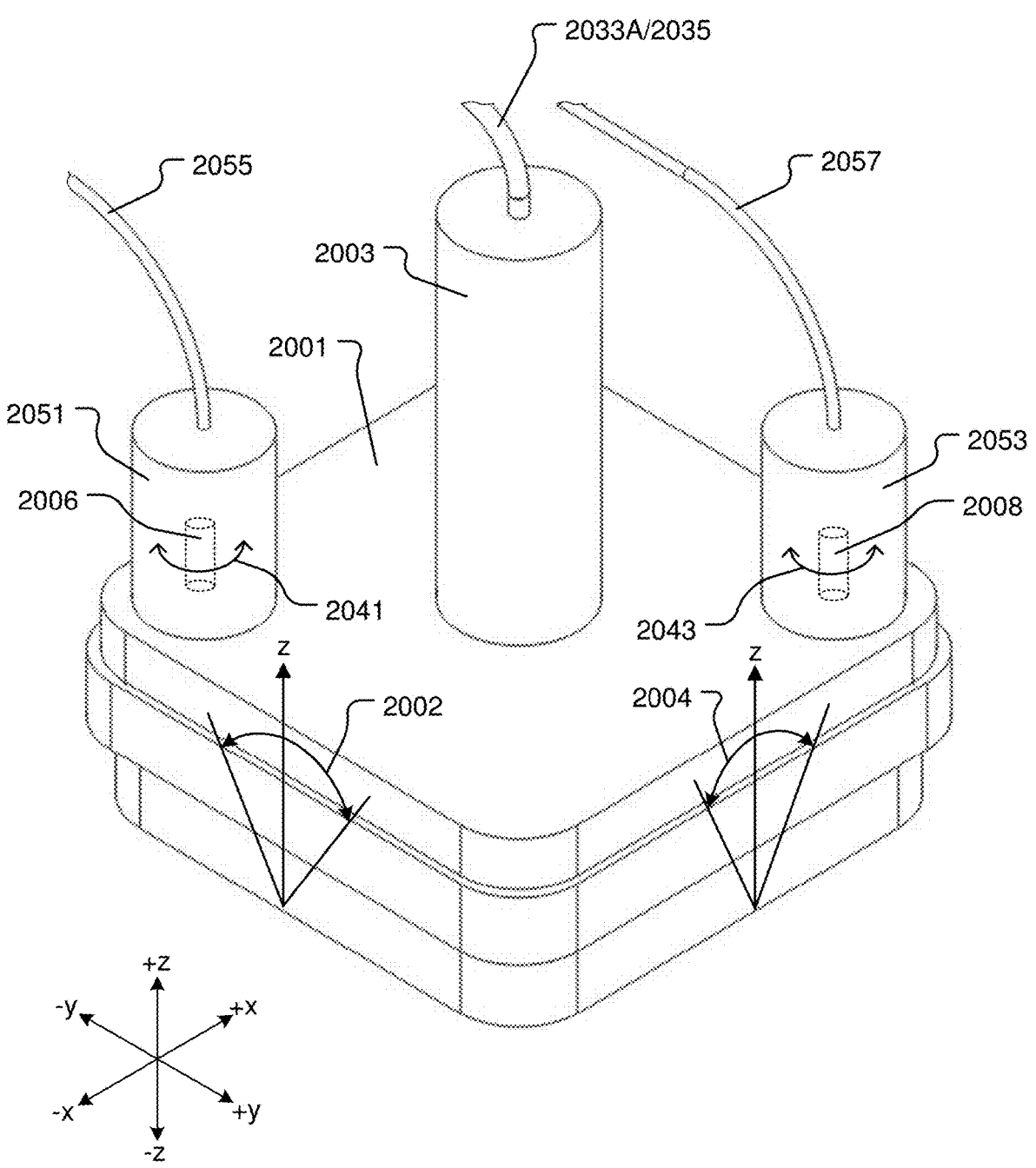
FIG. 10B shows an isolated view of the orientation control stage of the optical collimator including the first motorized adjustment mechanism and the second motorized adjustment mechanism, in accordance with some embodiments.

FIG. 10A shows the plasma processing system 100 with an open view of the metrology enclosure 115 and with the example spectral reflectometry system disposed within the metrology enclosure 115, where the spectral reflectometry system includes a first motorized adjustment mechanism 2051 and a second motorized adjustment mechanism 2053 connected to the orientation control stage 2001 for the optical collimator 2003, in accordance with some embodiments. FIG. 10B shows an isolated view of the orientation control stage 2001 of the optical collimator 2003 including the first motorized adjustment mechanism 2051 and the second motorized adjustment mechanism 2053, in accordance with some embodiments. The first motorized adjustment mechanism 2051 includes a first motor and associated mechanical linkage connected to the first screw 2006. The first motor is connected through a wired connection 2055 to the control system 2025. Control signals are transmitted through the wired connection 2055 to control operation of the first motorized adjustment mechanism 2051 to control rotation of the screw 2006, as indicated by arrow 2041, to control the tip angle 2002 of the orientation control stage 2001 for the optical collimator 2003. In this manner, the first motorized adjustment mechanism 2051 is configured to provide for remote (an optionally automatic) adjustment of the tip angle 2002 of the optical collimator 2003 in response to a first electrical control signal.

Similarly, the second motorized adjustment mechanism 2053 includes a second motor and associated mechanical linkage connected to the second screw 2008. The second motor is connected through a wired connection 2057 to the control system 2025. Control signals are transmitted through the wired connection 2057 to control operation of the second motorized adjustment mechanism 2053 to control rotation of the screw 2008, as indicated by arrow 2043, to control the tilt angle 2004 of the orientation control stage 2001 for the optical collimator 2003. In this manner, the second motorized adjustment mechanism 2053 is configured to provide for remote (and optionally automatic) adjustment of the tilt angle 2004 of the optical collimator 2003 in response to a second electrical control signal.

Figure 11A:
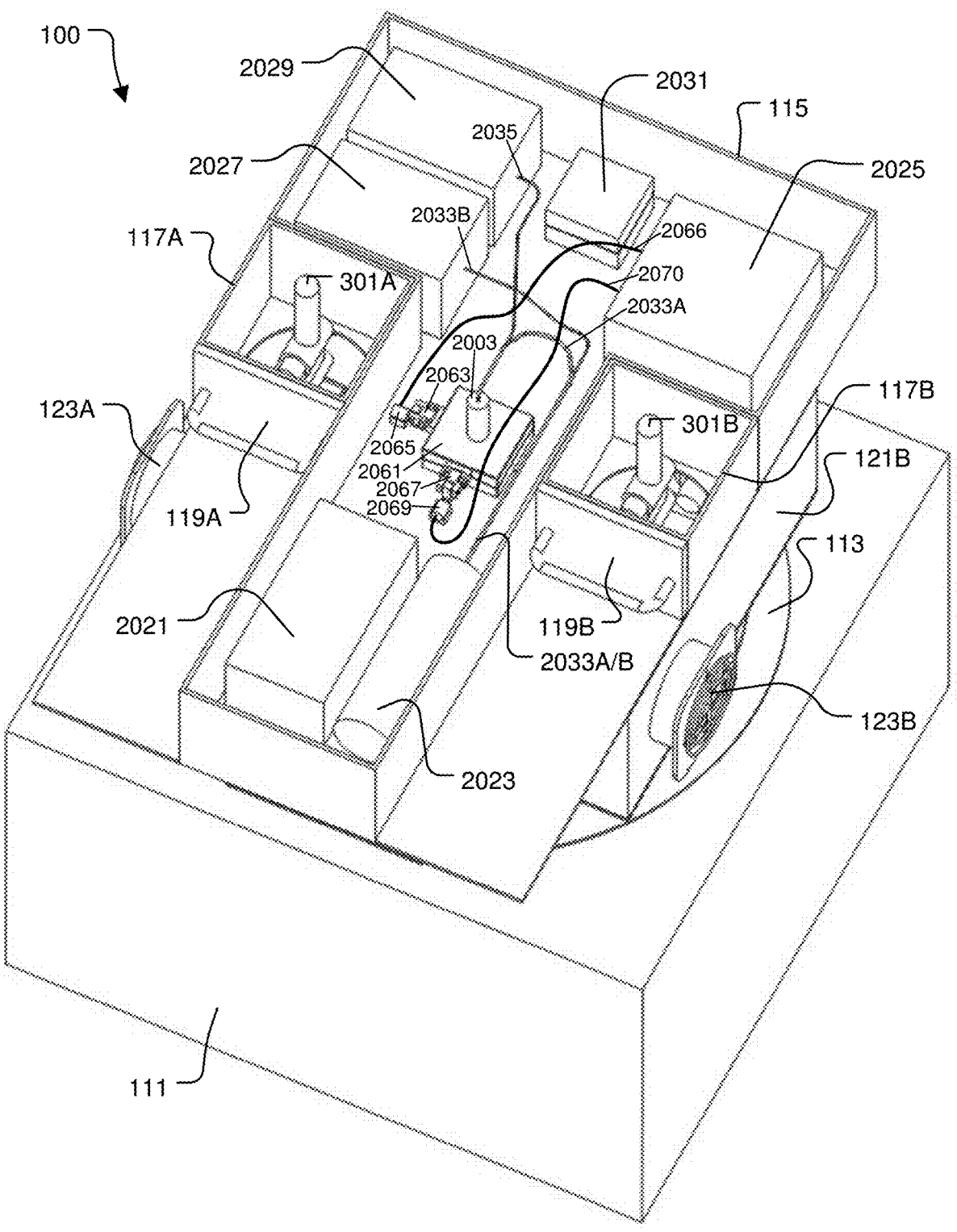
FIG. 11A shows the plasma processing system with an open view of the metrology enclosure and with the example spectral reflectometry system disposed within the metrology enclosure, where the spectral reflectometry system includes a planar-spherical orientation control stage for the optical collimator, in accordance with some embodiments.
Figure 11B:
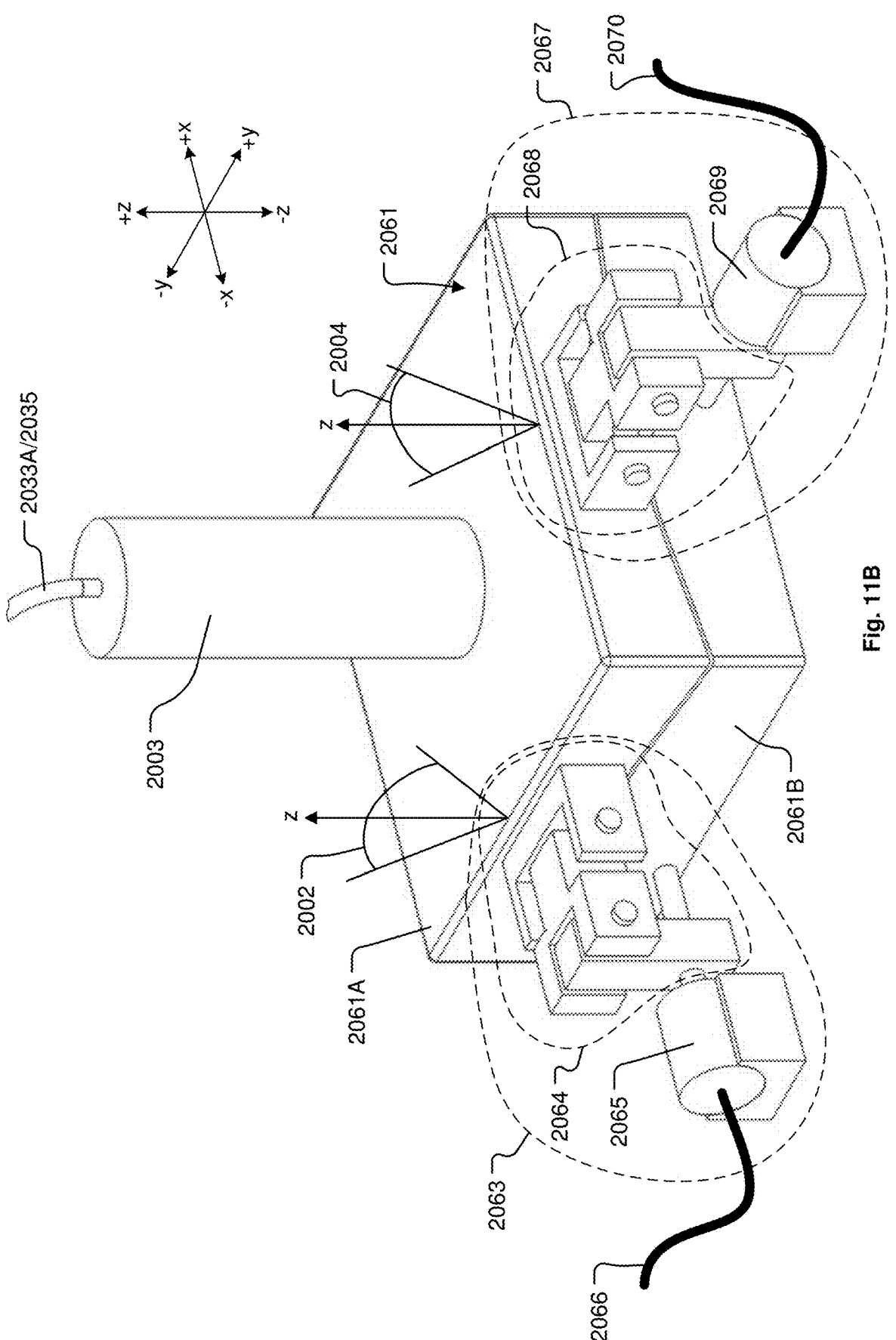
FIG. 11B shows an isolated view of the planar-spherical orientation control stage for the optical collimator, in accordance with some embodiments.

FIG. 11A shows the plasma processing system 100 with an open view of the metrology enclosure 115 and with the example spectral reflectometry system disposed within the metrology enclosure 115, where the spectral reflectometry system includes a planar-spherical orientation control stage 2061 for the optical collimator 2003, in accordance with some embodiments. FIG. 11B shows an isolated view of the planar-spherical orientation control stage 2061 for the optical collimator 2003, in accordance with some embodiments.

The planar-spherical orientation control stage 2061 includes an upper member 2061A and a lower member 2061B. The lower member 2061B has an upper surface configured as a portion of spherical cap. The upper member 2061A has a lower surface shaped conformally to the upper surface of the lower member 2061B. The upper member 2061A is movable relative to the lower member 2061B to control the tip angle 2002 of the optical collimator 2003 within the first vertical reference plane (parallel to the y-z reference plane). The upper member 2061A is also movable relative to the lower member 2061B to control the tilt angle 2004 of the optical collimator 2003 within the second vertical reference plane (parallel to the x-z reference plane), where the second vertical reference plane is perpendicular to the first vertical reference plane.

A first motorized adjustment mechanism 2063 is connected to provide for positioning of the upper member 2061A relative to the lower member 2061B (in the x-direction) to control the tilt angle 2004 of the optical collimator 2003 within the second vertical reference plane (parallel to the x-z reference plane). The first motorized adjustment mechanism 2063 includes a first motor 2065 and associated mechanical linkage 2064 connected to a shaft of the first motor 2065 and to the upper member 2061A. The first motorized adjustment mechanism 2063 operates in response to a first electrical control signal received through a wired connection 2066. Similarly, a second motorized adjustment mechanism 2067 is connected to provide for positioning of the upper member 2061A relative to the lower member 2061B (in the y-direction) to control the tip angle 2002 of the optical collimator 2003 within the first vertical reference plane (parallel to the y-z reference plane). The second motorized adjustment mechanism 2067 includes a second motor 2069 and associated mechanical linkage 2068 connected to a shaft of the second motor 2069 and to the upper member 2061A. The second motorized adjustment mechanism 2067 operates in response to a second electrical control signal received through a wired connection 2070.

Figure 11C:
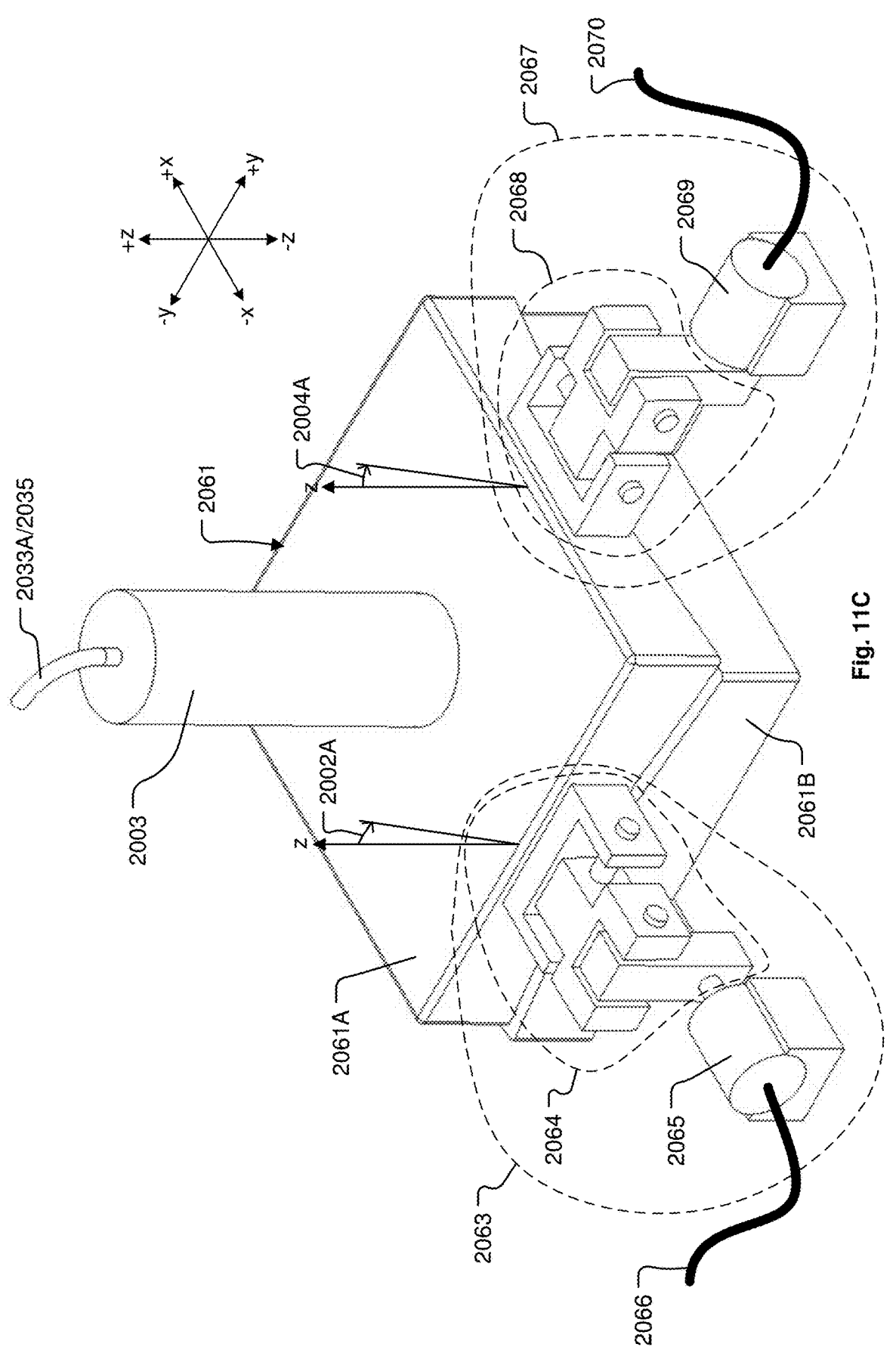
FIG. 11C shows the planar-spherical orientation control stage for the optical collimator with the first motorized adjustment mechanism operating to provide a positive tilt angle to the optical collimator, and with the second motorized adjustment mechanism operating to provide a positive tip angle to the optical collimator, in accordance with some embodiments.

FIG. 11C shows the planar-spherical orientation control stage 2061 for the optical collimator 2003 with the first motorized adjustment mechanism 2063 operating to provide a positive tilt angle 2004A to the optical collimator 2003, and with the second motorized adjustment mechanism 2067 operating to provide a positive tip angle 2002A to the optical collimator 2003, in accordance with some embodiments. FIG. 11C shows an example of how the first motorized adjustment mechanism 2063 and the second motorized adjustment mechanism 2067 operate in tandem to move the upper member 2061A relative to the lower member 2061B to achieve a desired tip angle 2002A and tilt angle 2004A of the optical collimator 2003. In this manner, the first motorized adjustment mechanism 2063 and the second motorized adjustment mechanism 2067 provide for remote (and optionally automatic) adjustment of the tip angle 2002 and/or tilt angle 2004 of the optical collimator 2003.

FIG. 12A shows a flowchart of a method for tuning an orientation of the optical collimator 2003 of the spectral reflectometry system for the plasma processing system 100, in accordance with some embodiments. The method includes an operation 2301 for performing a first raster scan of the optical collimator 2003 through a first set of tip angles (corresponding to tip angle 2002) and a first set of tilt angles (corresponding to tilt angle 2004). The first set of tip angles includes a plurality of different tip angles of the optical collimator 2003 within the first vertical reference plane (parallel to y-z reference plane). The first set of tip angles has a first angular step amount. For example, in some embodiments, the first set of tip angles includes five angles (−0.5 degree, −0.25 degree, 0 degree, +0.25 degree, +0.5 degree) extending from −0.5 degree to +0.5 degree, with a first angular step amount of 0.25 degree. Similarly, the first set of tilt angles includes a plurality of different tilt angles of the optical collimator 2003 within the second vertical reference plane (parallel to the x-z reference plane), where the second vertical reference plane is perpendicular to the first vertical reference plane. The first set of tilt angles also has the first angular step amount. For example, the first set of tip angles also includes five angles (−0.5 degree, −0.25 degree, 0 degree, +0.25 degree, +0.5 degree) extending from −0.5 degree to +0.5 degree, with the first angular step amount of 0.25 degree.

Figure 12B:
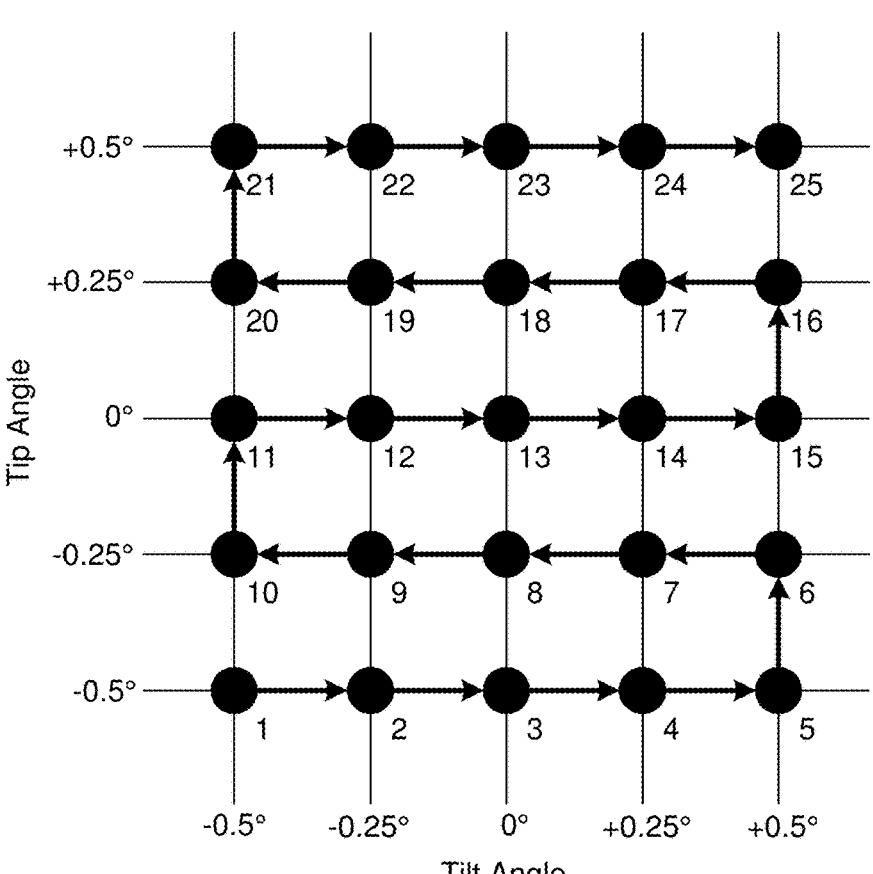
FIG. 12B shows a diagram of an example of the first raster scan, in accordance with some embodiments.

FIG. 12B shows a diagram of an example of the first raster scan, in accordance with some embodiments. The example first raster scan includes 25 scan points corresponding to the different combinations of the first set of five tip angles (−0.5 degree, −0.25 degree, 0 degree, +0.25 degree, +0.5 degree) and the first set of five tilt angles (−0.5 degree, −0.25 degree, 0 degree, +0.25 degree, +0.5 degree). Each combination of tip angle and tilt angle for the optical collimator 2003 in the first raster scan is a scan point at which a spectral intensity measurement is made using the optical collimator 2003. In this manner, the first raster scan provides a spectral intensity measurement at each different combination of tip angle and tilt angle in the first raster scan. FIG. 12B also shows arrows extending between the various scan points from scan point 1 to scan point 25 to indicate an example of how the tip angle and the tilt angle of the optical collimator 2003 is adjusted in some embodiments to move through the first raster scan in an efficient manner. In some embodiments, the first raster scan begins at a lowest tip angle within the first set of tip angles and at a lowest tilt angle within the first set of tilt angles. In these embodiments, the first raster scan increases the tilt angle by the first angular step amount after performing spectral intensity measurements at each tip angle within the first set of tip angles.

Figure 12C:
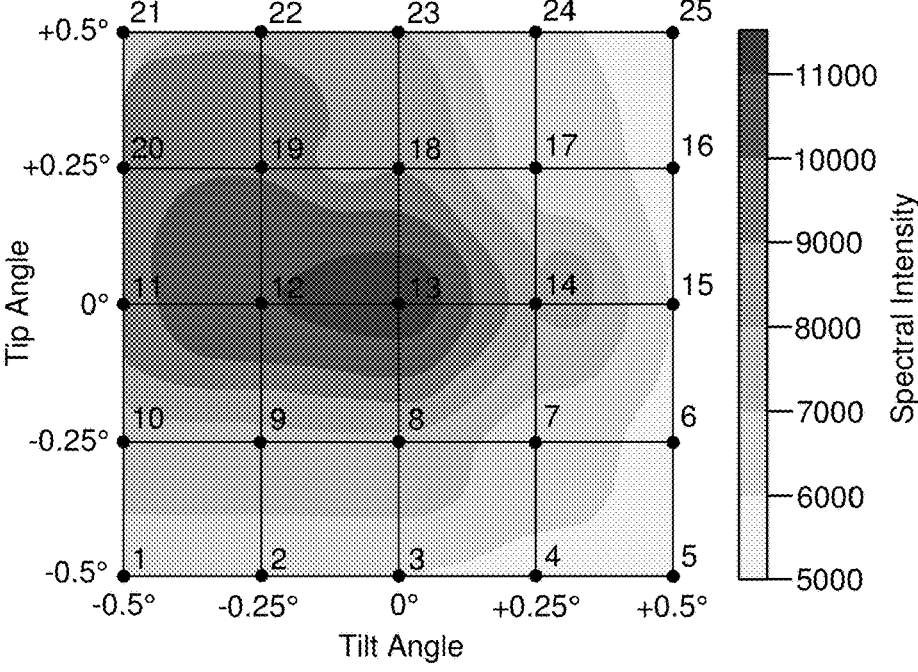
FIG. 12C shows an example of the spectral intensity measurement results based on the scan points in the first raster scan example of FIG. 12B, in accordance with some embodiments.

The method proceeds from the operation 2301 with an operation 2303 for identifying a reference tip angle and a reference tilt angle in the first raster scan corresponding to a maximum spectral intensity measurement within the first raster scan. FIG. 12C shows an example of the spectral intensity measurement results based on the 25 scan points in the first raster scan example of FIG. 12B, in accordance with some embodiments. The example spectral intensity measurement results of FIG. 12C indicate that the tip angle of zero degree and the tilt angle of zero degree corresponding to scan point 13 provides the highest spectral intensity measurement. Therefore, in this example, operation 2303 will identify the tip angle of zero degree as the reference tip angle and the tilt angle of zero degree as the reference tilt angle. It should be understood that FIG. 12C is just an example for purposes of description. In various embodiments, it is possible for any scan point in the first raster scan to have the highest spectral intensity measurement and thereby indicate the reference tip angle and the reference tilt angle.

The method proceed with an operation 2305 for performing a second raster scan of the optical collimator 2003 through a second set of tip angles and a second set of tilt angles. The second set of tip angles includes a plurality of different tip angles of the optical collimator 2003 within the first vertical reference plane (parallel to y-z reference plane). The second set of tip angles is centered about the reference tip angle identified in operation 2303. The second set of tip angles for the second raster scan has a second angular step amount that is smaller than the first angular step amount used in the first raster scan. For example, in some embodiments, the second set of tip angles includes five angles (−0.2 degree, −0.1 degree, 0 degree, +0.1 degree, +0.2 degree) extending from −0.2 degree to +0.2 degree, with a second angular step amount of 0.1 degree. Similarly, the second set of tilt angles includes a plurality of different tilt angles of the optical collimator 2003 within the second vertical reference plane (parallel to the x-z reference plane). The second set of tilt angles is centered about the reference tilt angle identified in operation 2303. The second set of tilt angles also has the second angular step amount. For example, in some embodiments, the second set of tilt angles includes five angles (−0.2 degree, −0.1 degree, 0 degree, +0.1 degree, +0.2 degree) extending from −0.2 degree to +0.2 degree, with the second angular step amount of 0.1 degree. The second raster scan provides a spectral intensity measurement at each different combination of tip angle and tilt angle in the second raster scan.

Figure 12D:
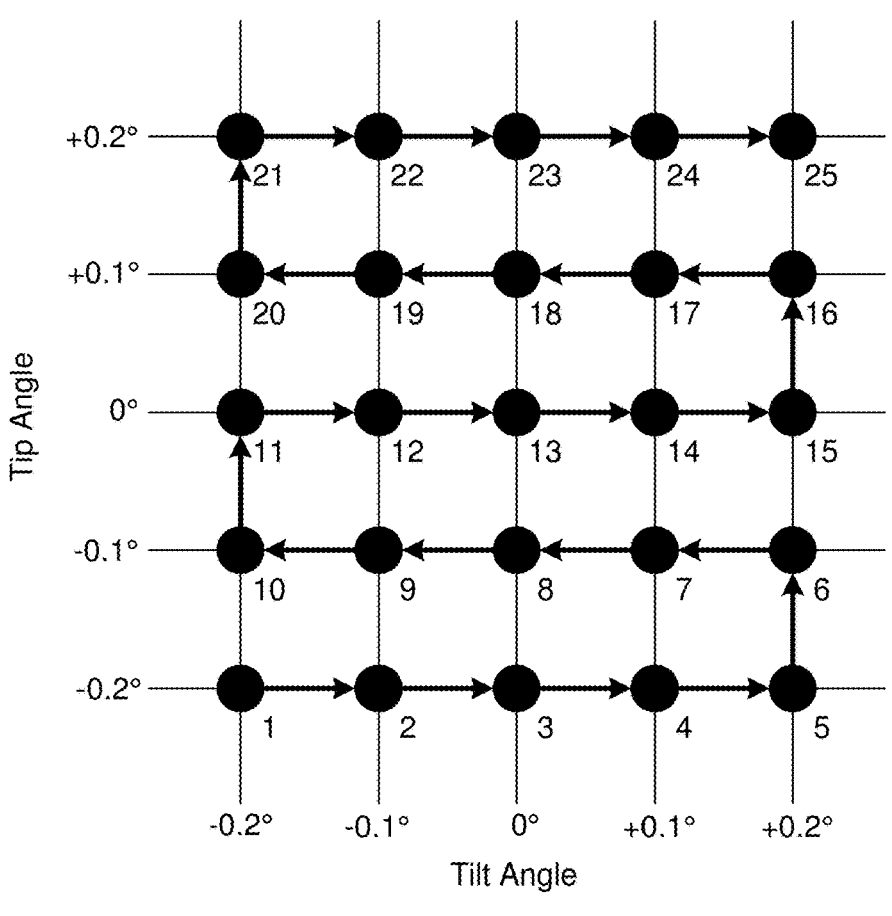
FIG. 12D shows a diagram of an example of the second raster scan, in accordance with some embodiments.

FIG. 12D shows a diagram of an example of the second raster scan, in accordance with some embodiments. The example second raster scan includes 25 scan points corresponding to the different combinations of the second set of five tip angles (−0.2 degree, −0.1 degree, 0 degree, +0.1 degree, +0.2 degree) and the second set of five tilt angles (−0.2 degree, −0.1 degree, 0 degree, +0.1 degree, +0.2 degree). Each combination of tip angle and tilt angle for the optical collimator 2003 in the second raster scan is a scan point at which a spectral intensity measurement is made using the optical collimator 2003. In this manner, the second raster scan provides a spectral intensity measurement at each different combination of tip angle and tilt angle in the second raster scan. FIG. 12D also shows arrows extending between the various scan points from scan point 1 to scan point 25 to indicate an example of how the tip angle and the tilt angle of the optical collimator 2003 is adjusted in some embodiments to move through the second raster scan in an efficient manner. In some embodiments, the second raster scan begins at a lowest tip angle within the second set of tip angles and at a lowest tilt angle within the second set of tilt angles. In these embodiments, the second raster scan increases the tilt angle by the second angular step amount after performing spectral intensity measurements at each tip angle within the second set of tip angles.

Figure 12E:
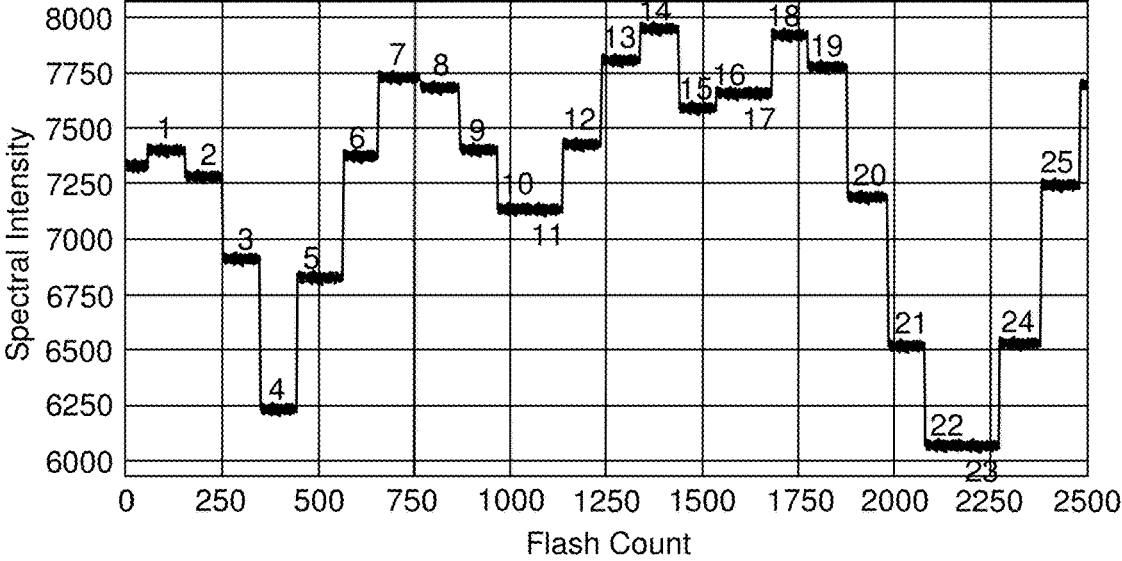
FIG. 12E shows an example plot of spectral intensity measured during the second raster scan of the optical collimator, in accordance with some embodiments.

FIG. 12E shows an example plot of spectral intensity measured during the second raster scan of the optical collimator 2003, in accordance with some embodiments. The plot of FIG. 12E indicates that scan point 14 in the second raster scan provides the maximum spectral intensity measurement. After the second raster scan in operation 2305, the method proceeds with an operation 2307 for orienting the optical collimator 2003 at a tuned tip angle and a tuned tilt angle respectively corresponding to the combination of tip angle and tilt angle in the second raster scan that has a maximum spectral intensity measurement within the second raster scan. For example, in the second raster scan spectral measurements of FIG. 12E, the tip angle and the tilt angle corresponding to scan point 14 are used as the tuned tip angle and the tuned tilt angle, respectively, in performing operation 2307.

FIG. 13A shows a flowchart of a method for tuning an orientation of the optical collimator 2003 of the spectral reflectometry system for the plasma processing system 100, in accordance with some embodiments. The method includes an operation 2401 for performing spectral intensity measurements at multiple different combinations of a tip angle and a tilt angle of the optical collimator 2003, where the tip angle of the optical collimator 2003 is measured within the first vertical reference plane (parallel to the y-z reference plane), and where the tilt angle of the optical collimator 2003 is measured within the second vertical reference plane (parallel to the x-z reference plane), where the second vertical reference plane is perpendicular to the first vertical reference plane.

Figures 13B, 13C:
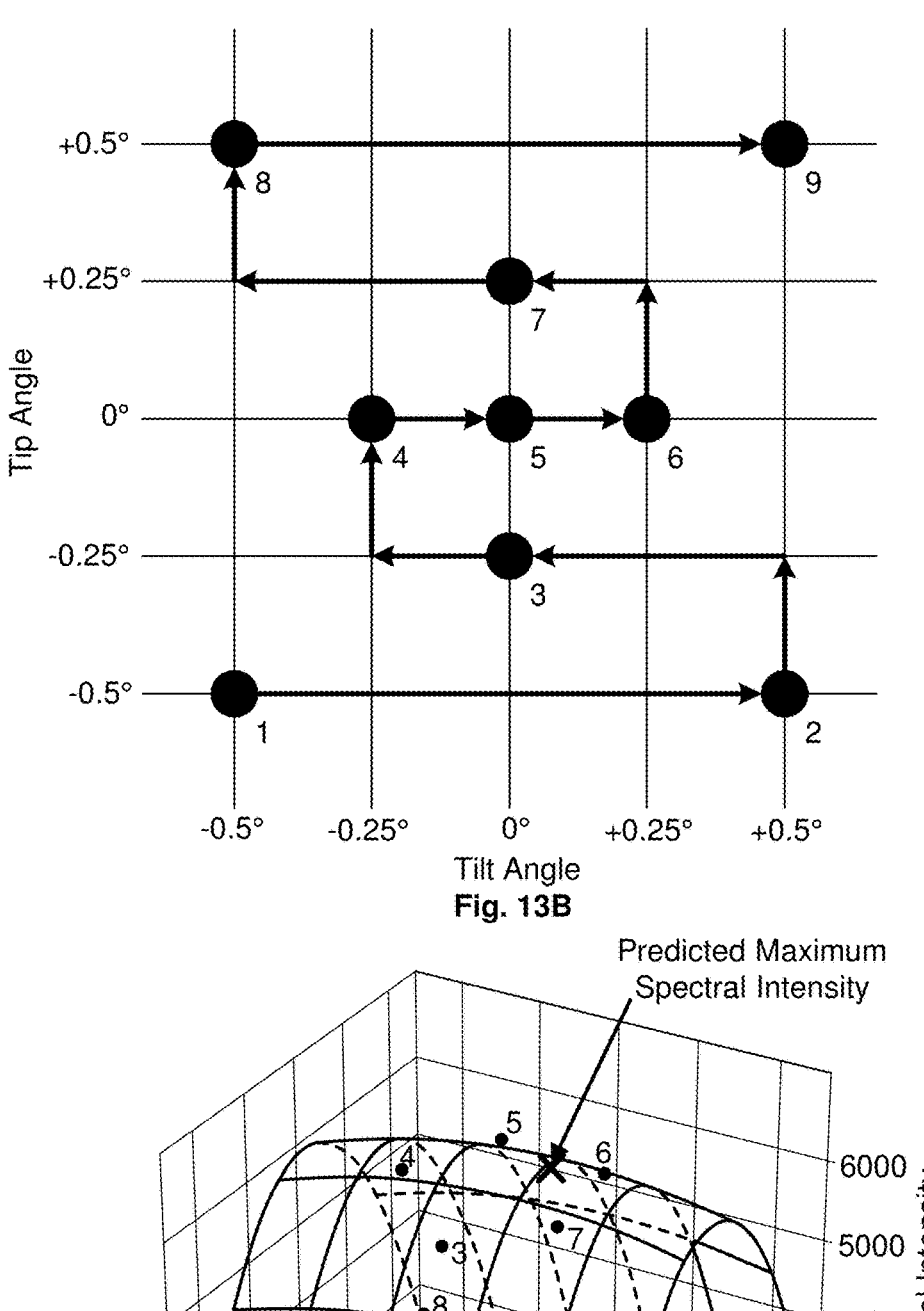
FIG. 13B shows a diagram of an example of nine different combinations of tip angle and tilt angle of the optical collimator used in performing operation, in accordance with some embodiments.
FIG. 13C shows an example gaussian function fit to spectral intensity measurements at the nine different tip angle and tilt angle combinations in operation, in accordance with some embodiments.

In some embodiments, the operation 2401 includes performing spectral intensity measurements at nine different combinations of a tip angle and a tilt angle of the optical collimator 2003. FIG. 13B shows a diagram of an example of nine (1-9) different combinations of tip angle and tilt angle of the optical collimator 2003 used in performing operation 2401, in accordance with some embodiments. The nine different combinations of a tip angle and a tilt angle of the optical collimator 2003 include four outer scan points (1, 2, 8, 9) and five inner scan points (3, 4, 5, 6, 7). FIG. 13B also shows arrows extending between the various scan points from scan point 1 to scan point 9 to indicate an example of how the tip angle and the tilt angle of the optical collimator 2003 is adjusted in some embodiments to move through the different combinations of tip angle and tilt angle in an efficient manner. In some other embodiments, spectral intensity measurements are made at the four outer scan points (1, 2, 8, 9) first, followed by spectral intensity measurements at the five inner scan points (3, 4, 5, 6, 7). In some embodiments, the four outer scan points (1, 2, 8, 9) span one degree in tip angle and one degree in tilt angle. For example, scan point 1 is at a tip angle of –0.5 degree and a tilt angle of –0.5 degree. Scan point 2 is at a tip angle of –0.5 degree and a tilt angle of +0.5 degree. Scan point 8 is at a tip angle of +0.5 degree and a tilt angle of –0.5 degree. Scan point 9 is at a tip angle of +0.5 degree and a tilt angle of +0.5 degree. In some embodiments, the five inner scan points (3, 4, 5, 6, 7) span 0.5 degree in tip angle and 0.5 degree in tilt angle. For example, scan point 3 is at a tip angle of –0.25 degree and a tilt angle of 0 degree. Scan point 4 is at a tip angle of 0 degree and a tilt angle of –0.25 degree. Scan point 5 is at a tip angle of 0 degree and a tilt angle of 0 degree. Scan point 6 is at a tip angle of 0 degree and a tilt angle of +0.25 degree. Scan point 7 is at a tip angle of +0.25 degree and a tilt angle of 0 degree. It should be understood that in other embodiments, either more or less than nine different combinations of tip angle and tilt angle can be used for spectral intensity measurements in operation 2401.

The method continues with an operation 2403 for determining a predicted tip angle and a predicted tilt angle of the optical collimator 2003 corresponding to a predicted maximum spectral intensity based on the spectral intensity measurements of operation 2401. In some embodiments, the operation 2403 includes fitting a function (e.g., a gaussian function) to the spectral intensity measurements obtained in operation 2401. FIG. 13C shows an example gaussian function fit to spectral intensity measurements at the nine different tip angle and tilt angle combinations in operation 2401, in accordance with some embodiments. The function is then used to determine a predicted maximum spectral intensity and the predicted tip angle and the predicted tilt angle of the optical collimator 2003 corresponding to the predicted maximum spectral intensity.

The method continues with an operation 2405 for orienting the optical collimator 2003 at a starting tip angle and a starting tilt angle, where the starting tip angle is a prescribed amount less than the predicted tip angle determined in operation 2403, and where the starting tilt angle is the prescribed amount less than the predicted tilt angle determined in operation 2403. In some embodiments, the prescribed amount in operation 2405 is about 0.3 degree. However, in other embodiments, the prescribed amount in operation 2405 is either less than about 0.3 degree or greater than about 0.3 degree. The method proceeds from the operation 2405 with an operation 2407 for performing a slope-ascent search process to identify a tuned tip angle and a tuned tilt angle of the optical collimator 2003 that provide a maximum spectral intensity measurement. The slope-ascent search process begins at the starting tip angle and the starting tilt angle. The slope-ascent search process concludes with the optical collimator 2003 oriented at the tuned tip angle and the tuned tilt angle. In some embodiments, the slope-ascent search process of operation 2407 includes performing multiple tip angle ascent steps and multiple tilt angle ascent steps until a change in measured spectral intensity with respect to tip angle and tilt angle (spectral intensity slope) is less than a prescribed threshold value. In some embodiments, the prescribed threshold value is about 0.1. However, in other embodiments, the prescribed threshold value is either less than about 0.1 or greater than about 0.1.

FIG. 13D shows a flowchart of a method for performing each tip angle ascent step in the slope-ascent search process, in accordance with some embodiments. The method includes an operation 2409 for performing a spectral intensity measurement with the optical collimator 2003 at a current tip angle and a current tilt angle. The method continues with an operation 2411 for increasing the tip angle of the optical collimator 2003 by a tip adjustment amount. The method continues with an operation 2413 for performing another spectral intensity measurement with the optical collimator 2003 at the adjusted tip angle and the current tilt angle. The method continues with an operation 2415 for determining a slope of spectral intensity change with respect to tip angle change based on the spectral intensity measurements of operations 2409 and 2413. The method continues with an operation 2417 for decreasing the tip adjustment amount for use in the operation 2411 in the next tip angle ascent step when the slope as determined in the operation 2415 has decreased relative to the slope as determined in the operation 2415 in the previous tip angle ascent step. The operation 2417 also includes maintaining the tip adjustment amount at its current setting in the next tip angle ascent step when the slope as determined in operation 2415 has not decreased relative to the slope as determined in the operation 2415 in the previous tip angle ascent step. In some embodiments, the tip adjustment amount starts at about 0.075 degree in the slope-ascent search process. However, in other embodiments, the tip adjustment amount starts at an amount either less than or greater than 0.075 degree.

FIG. 13E shows a flowchart of a method for performing each tilt angle ascent step in the slope-ascent search process, in accordance with some embodiments. The method includes an operation 2419 for performing a spectral intensity measurement with the optical collimator 2003 at a current tip angle and a current tilt angle. The method continues with an operation 2421 for increasing the tilt angle of the optical collimator 2003 by a tilt adjustment amount. The method continues with an operation 2423 for performing another spectral intensity measurement with the optical collimator 2003 at the current tip angle and the adjusted tilt angle. The method continues with an operation 2425 for determining a slope of spectral intensity change with respect to tilt angle change based on the spectral intensity measurements of operations 2419 and 2423. The method continues with an operation 2427 for decreasing the tilt adjustment amount for use in the operation 2421 in the next tilt angle ascent step when the slope as determined in the operation 2425 has decreased relative to the slope as determined in the operation 2425 in the previous tilt angle ascent step. The operation 2427 also includes maintaining the tilt adjustment amount at its current setting in the next tilt angle ascent step when the slope as determined in operation 2425 has not decreased relative to the slope as determined in the operation 2425 in the previous tilt angle ascent step. In some embodiments, the tilt adjustment amount starts at about 0.075 degree in the slope-ascent search process. However, in other embodiments, the tilt adjustment amount starts at an amount either less than or greater than 0.075 degree.

FIG. 13F shows an example plot of spectral intensity as a function of tip angle and tilt angle in the slope-ascent search process performed in the operation 2407, in accordance with some embodiments. Scan point 1 corresponds to the spectral intensity measured with the optical collimator 2003 oriented at the starting tip angle and the starting tilt angle as done in operation 2405. Scan points 2-10 correspond to the spectral intensity measurements made as the tip angle and the tilt angle of the optical collimator 2003 are adjusted in accordance with the tip angle ascent step process of FIG. 13D and the tilt angle ascent step process of FIG. 13E, respectively. The slope-ascent search process concludes with scan point 10 at which point the change in measured spectral intensity with respect to tip angle and tilt angle is less than the prescribed threshold value, e.g., less than about 0.1. Therefore, the tip angle and the tilt angle of the optical collimator 2003 at scan point 10 are the tuned tip angle and the tuned tilt angle, respectively, for the optical collimator 2003. It should be understood that the slope-ascent search process can include either less than or more than 10 scan points, depending on how many scan points are needed for the change in measured spectral intensity with respect to tip angle and tilt angle to be less than the prescribed threshold value.

The various embodiments described herein may be practiced in conjunction with various computer system configurations including hand-held hardware units, microprocessor systems, microprocessor-based or programmable consumer electronics, minicomputers, mainframe computers and the like. The various embodiments described herein can also be practiced in conjunction with distributed computing environments where tasks are performed by remote processing hardware units that are linked through a computer network.

In some embodiments, a control system, e.g., host computer system, is provided for controlling the plasma processing system 100. In various embodiments, the plasma processing system 100 includes semiconductor processing equipment, such as processing tool(s), chamber(s), platform (s) for processing, and/or specific processing components such as a wafer pedestal, a gas flow system, among other components. In various embodiments, the plasma processing system 100 is integrated with electronics for controlling its operation before, during, and after processing of a semiconductor wafer or substrate, where the electronics are implemented within a controller that is configured and connected to control various components and/or sub-parts of the plasma processing system 100. Depending on substrate/ wafer processing requirements and/or the particular configuration of the plasma processing system 100, the controller is programmed to control any process and/or component disclosed herein, including a delivery of process gas(es), temperature settings (e.g., heating and/or cooling), pressure settings, vacuum settings, power settings, first/second direct-drive RF signal generator 101A/101B settings, first/second reactive circuit 901/1001 settings, electrical signal frequency settings, gas flow rate settings, fluid delivery settings, positional and operation settings, substrate/wafer transfers into and out of the plasma processing chamber 111 and/or into and out of load locks connected to or interfaced with the plasma processing system 100, collimator 2003 tip angle settings, and collimator 2003 tilt angle settings, among others.

Broadly speaking, in a variety of embodiments, the controller that is connected to control operations of the plasma processing system 100 is defined as electronics having various integrated circuits, logic, memory, and/or software that direct and control various tasks/operations, such as receiving instructions, issuing instructions, controlling device operations, enabling cleaning operations, enabling endpoint measurements, enabling metrology measurements (optical, thermal, electrical, etc.), among other tasks/operations. In some embodiments, the integrated circuits within the controller include one or more of firmware that stores program instructions, a digital signal processors (DSP), an Application Specific Integrated Circuit (ASIC) chip, a programmable logic device (PLD), one or more microprocessors, and/or one or more microcontrollers that execute program instructions (e.g., software), among other computing devices. In some embodiments, the program instructions are communicated to the controller in the form of various individual settings (or program files), defining operational parameters for carrying out a process on a substrate/wafer within the plasma processing system 100. In some embodiments, the operational parameters are included in a recipe defined by process engineers to accomplish one or more processing steps during the fabrication of one or more layers, materials, metals, oxides, silicon, silicon dioxide, surfaces, circuits, and/or dies on the substrate/wafer.

In some embodiments, the controller is a part of, or connected to, a computer that is integrated with, or connected to, the plasma processing system 100, or that is otherwise networked to the plasma processing system 100, or a combination thereof. For example, in some embodiments, the controller is implemented in a "cloud" or all or a part of a fab host computer system, which allows for remote access for control of substrate/wafer processing by the plasma processing system 100. The controller enables remote access to the plasma processing system 100 to provide for monitoring of current progress of fabrication operations, provided for examination of a history of past fabrication operations, provide for examination of trends or performance metrics from a plurality of fabrication operations, provide for changing of processing parameters, provide for setting of subsequent processing steps, and/or provide for initiation of a new substrate/wafer fabrication process.

In some embodiments, a remote computer, such as a server computer system, provides process recipes to the controller of the plasma processing system 100 over a computer network, which includes a local network and/or the Internet. The remote computer includes a user interface that enables entry or programming of parameters and/or settings, which are then communicated to the controller of the plasma processing system 100 from the remote computer. In some examples, the controller receives instructions in the form of settings for processing a substrate/wafer within the plasma processing system 100. It should be understood that the settings are specific to a type of process to be performed on a substrate/wafer and a type of tool/ device/component that the controller interfaces with or controls. In some embodiments, the controller is distributed, such as by including one or more discrete controllers that are networked together and synchronized to work toward a common purpose, such as operating the plasma processing system 100 to perform a prescribed process on a substrate/ wafer. An example of a distributed controller for such purposes includes one or more integrated circuits on a chamber in communication with one or more integrated circuits located remotely (such as at a platform level or as part of a remote computer) that combine to control a process in a chamber. Depending on a process operation to be performed by the plasma processing system 100, the controller communicates with one or more of other tool circuits or modules, other tool components, cluster tools, other tool interfaces, adjacent tools, neighboring tools, tools located throughout a factory, a main computer, another controller, or tools used in material transport that bring containers of substrates/wafers to and from tool locations and/or load ports in a semiconductor manufacturing factory.

It should be understood that, in some embodiments, operation of the plasma processing system 100 includes performance of various computer-implemented operations involving data stored in computer systems. These computer-implemented operations are those that manipulate physical quantities. In various embodiments, the computer-implemented operations are performed by either a general purpose computer or a special purpose computer. In some embodiments, the computer-implemented operations are performed by a selectively activated computer, and/or are directed by one or more computer programs stored in a computer memory or obtained over a computer network. When computer programs and/or digital data is obtained over the computer network, the digital data may be processed by other computers on the computer network, e.g., a cloud of computing resources. The computer programs and digital data are stored as computer-readable code on a non-transitory computer-readable medium. The non-transitory computer-readable medium is any data storage hardware unit, e.g., a memory device, etc., that stores data, which is thereafter readable by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), digital video/versatile disc (DVD), magnetic tapes, and other optical and non-optical data storage hardware units. In some embodiments, the computer programs and/or digital data are distributed among multiple computer-readable media located in different computer systems within a network of coupled computer systems, such that the computer programs and/or digital data is executed and/or stored in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A plasma processing system, comprising:
a plasma processing chamber having an upper window;
a coil disposed above the upper window;
a coil connection enclosure disposed above the coil;
a metrology enclosure disposed above the coil connection enclosure; and
a spectral reflectometry system disposed within the metrology enclosure, the spectral reflectometry system including:
an optical collimator positioned to direct a beam of light through an opening in the metrology enclosure, an opening in the coil connection enclosure, and the upper window into the plasma processing chamber, the optical collimator configured to receive reflected light from within the plasma processing chamber, the reflected light passing through the upper window and through the opening in the coil connection enclosure and through the opening in the metrology enclosure; and
an orientation control stage for the optical collimator, the orientation control stage including a lower member and an upper member, the lower member having an upper surface configured as a portion of a spherical cap, the upper member having a lower surface shaped conformally to the upper surface of the lower member, the upper member movable relative to the lower member.

2. The plasma processing system as recited in claim 1, wherein the spectral reflectometry system within the metrology enclosure includes a lamp, a power supply, and a spectrometer.

3. The plasma processing system as recited in claim 2, wherein a direct-drive radiofrequency power supply is positioned above the metrology enclosure, the direct-drive radiofrequency power supply connected to transmit radiofrequency power to the coil.

4. The plasma processing system as recited in claim 1, the orientation control stage further including a tip adjustment device for controlling a tip angle of the optical collimator within a first vertical reference plane.

5. The plasma processing system as recited in claim 4, the orientation control stage further including a tilt adjustment device for controlling a tilt angle of the optical collimator within a second vertical reference plane, the second vertical reference plane perpendicular to the first vertical reference plane.

6. The plasma processing system as recited in claim 5, the spectral reflectometry system further including a first adjustment mechanism extending from outside of the metrology enclosure to the tip adjustment device, the first adjustment mechanism configured to provide for manual adjustment of the tip angle of the optical collimator from a first location outside of the metrology enclosure.

7. The plasma processing system as recited in claim 6, the spectral reflectometry system further including a second adjustment mechanism extending from outside of the metrology enclosure to the tilt adjustment device, the second adjustment mechanism configured to provide for manual adjustment of the tilt angle of the optical collimator from a second location outside of the metrology enclosure.

8. The plasma processing system as recited in claim 7, the first adjustment mechanism including a first rod extending from the first location to a first rotational transfer device configured to translate rotation of the first rod into rotation of a first screw within the tip adjustment device.

9. The plasma processing system as recited in claim 8, the second adjustment mechanism including a second rod extending from the second location to a second rotational transfer device configured to translate rotation of the second rod into rotation of a second screw within the tilt adjustment device.

10. The plasma processing system as recited in claim 9, the first rotational transfer device including a first gear box.

11. The plasma processing system as recited in claim 10, the second rotational transfer device including a second gear box.

12. The plasma processing system as recited in claim 5, the spectral reflectometry system further including a first motorized adjustment mechanism connected for control of the tip adjustment device, the first motorized adjustment mechanism configured to provide for remote adjustment of the tip angle of the optical collimator in response to a first electrical control signal.

13. The plasma processing system as recited in claim 12, the spectral reflectometry system further including a second motorized adjustment mechanism connected for control of the tilt adjustment device, the second motorized adjustment mechanism configured to provide for remote adjustment of the tilt angle of the optical collimator in response to a second electrical control signal.

14. The plasma processing system as recited in claim 1, wherein a position of the orientation control stage relative to the metrology enclosure is remotely adjustable.

15. The plasma processing system as recited in claim 1, the upper member movable relative to the lower member to control a tip angle of the optical collimator within a first vertical reference plane.

16. The plasma processing system as recited in claim 15, the upper member also movable relative to the lower member to control a tilt angle of the optical collimator within a second vertical reference plane, the second vertical reference plane perpendicular to the first vertical reference plane.

17. The plasma processing system as recited in claim 16, the spectral reflectometry system including a first motorized adjustment mechanism connected to provide for positioning of the upper member relative to the lower member to control the tilt angle of the optical collimator within the second vertical reference plane, the first motorized adjustment mechanism operable in response to a first electrical control signal.

18. The plasma processing system as recited in claim 17, the spectral reflectometry system further including a second motorized adjustment mechanism connected to provide for positioning of the upper member relative to the lower member to control the tip angle of the optical collimator within the first vertical reference plane, the second motorized adjustment mechanism operable in response to a second electrical control signal.

* * * * *